United States Patent
Jung et al.

(10) Patent No.: US 9,224,495 B2
(45) Date of Patent: Dec. 29, 2015

(54) NONVOLATILE MEMORY DEVICE AND METHOD DETECTING DEFECTIVE WORD LINE

(71) Applicants: Bong-Kil Jung, Seoul (KR); Daeseok Byeon, Seongnam-si (KR)

(72) Inventors: Bong-Kil Jung, Seoul (KR); Daeseok Byeon, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/476,151

(22) Filed: Sep. 3, 2014

(65) Prior Publication Data

US 2015/0117105 A1    Apr. 30, 2015

(30) Foreign Application Priority Data

Oct. 31, 2013    (KR) .................. 10-2013-0131332

(51) Int. Cl.
*G11C 16/34*    (2006.01)
*G11C 16/04*    (2006.01)

(52) U.S. Cl.
CPC ........ *G11C 16/3459* (2013.01); *G11C 16/0483* (2013.01)

(58) Field of Classification Search
CPC .................. G11C 16/3459; G11C 16/0483
USPC ........................ 365/185.12, 185.17, 185.09
See application file for complete search history.

(56) References Cited

U.S. PATENT DOCUMENTS

| | | | | |
|---|---|---|---|---|
| 5,132,928 A * | 7/1992 | Hayashikoshi | ..... | G06F 11/1008 365/185.09 |
| 5,428,621 A * | 6/1995 | Mehrotra | ....... | G11C 29/02 714/711 |
| 5,903,495 A * | 5/1999 | Takeuchi | .......... | G11C 11/5621 365/185.03 |
| 6,545,910 B2 | 4/2003 | Byeon et al. | | |
| 7,212,454 B2 | 5/2007 | Kleveland et al. | | |
| 7,405,986 B2 | 7/2008 | Versen et al. | | |
| 7,616,484 B2 * | 11/2009 | Auclair | .................. | G11C 16/10 365/185.09 |
| 8,054,680 B2 * | 11/2011 | Matsuzaki | .......... | G11C 16/107 257/324 |
| 8,305,807 B2 * | 11/2012 | Shah | ...................... | G11C 29/02 365/185.09 |
| 8,379,454 B2 * | 2/2013 | Kochar | .............. | G11C 16/3459 365/185.19 |
| 8,432,732 B2 | 4/2013 | Li et al. | | |
| 8,514,630 B2 | 8/2013 | Huynh et al. | | |
| 2008/0316830 A1 * | 12/2008 | Yang et al. | ............... | 365/185.18 |
| 2009/0063918 A1 * | 3/2009 | Chen | ........................ | G11C 8/08 714/721 |
| 2010/0091568 A1 * | 4/2010 | Li et al. | .................... | 365/185.09 |
| 2012/0317458 A1 | 12/2012 | So et al. | | |
| 2013/0031429 A1 * | 1/2013 | Sharon | ................ | G06F 11/1048 714/718 |
| 2013/0114342 A1 * | 5/2013 | Sakai | .................... | G11C 29/025 365/185.17 |
| 2014/0085985 A1 * | 3/2014 | Pan | ........................ | G11C 5/145 365/185.18 |

* cited by examiner

*Primary Examiner* — Vu Le
*Assistant Examiner* — Sung Cho
(74) *Attorney, Agent, or Firm* — Volentine & Whitt, PLLC

(57) ABSTRACT

The inventive concept relates to a nonvolatile memory device and a method of detecting a defective word line. The method includes executing a defective word line detection operation using a program/erase voltage applied to a selected word line, wherein the defective word line detection operation determines whether or not the selected word line is defective in relation to respective word line voltage responses for the first and second segments during execution of the program/erase operation.

20 Claims, 25 Drawing Sheets

NONVOLATILE MEMORY DEVICE AND METHOD DETECTING DEFECTIVE WORD LINE

CROSS-REFERENCE TO RELATED APPLICATIONS

This U.S. non-provisional patent application claims priority under 35 U.S.C. §119 to Korean Patent Application No. 10-2013-0131332 filed on Oct. 31, 2013, the subject matter of which is hereby incorporated by reference.

BACKGROUND

The present inventive concept relates to nonvolatile memory devices and methods of detecting a defective word line in memory devices.

As contemporary semiconductor memory devices, including nonvolatile memory devices, become more densely integrated, the hazard of defective word lines in a memory cell array increases. Better methods of determining whether a word line is defective are needed.

SUMMARY

Embodiments of the inventive concept provide a nonvolatile memory device comprising; a voltage generator, a memory cell array comprising a word line including first and second segments, wherein the first segment includes first memory cells being less than a prescribed distance from a voltage generator and the second segment includes second memory cells being more than the prescribed distance from the voltage generator, and control logic configured to determine whether or not the word line is defective in relation to respective word line voltage responses for the first and second segments during one of a program operation and an erase operation directed to a page of data stored by the first and second memory cells.

Embodiments of the inventive concept provide a method of detecting a defective word line in a nonvolatile memory device including a plurality of word lines, wherein each word line includes first and second segments, the first segment including first memory cells being less than a prescribed distance from a voltage generator and the second segment including second memory cells being more than the prescribed distance from the voltage generator, the method comprising; entering a defective word line detection mode, and in response to a received program command indicating a program operation directed to the first and second memory cells, executing a defective word line detection operation using a program voltage applied to a selected word line, wherein the defective word line detection operation determines whether or not the selected word line is defective in relation to respective word line voltage responses for the first and second segments during execution of the program operation.

Embodiments of the inventive concept provide a method of detecting a defective word line in a nonvolatile memory device including a plurality of word lines, wherein each word line includes first and second segments, the first segment including first memory cells being less than a prescribed distance from a voltage generator and the second segment including second memory cells being more than the prescribed distance from the voltage generator, the method comprising; entering a defective word line detection mode, and in response to a received erase command indicating an erase operation directed to the first and second memory cells, executing a defective word line detection operation using an erase voltage applied to a selected word line, wherein the defective word line detection operation determines whether or not the selected word line is defective in relation to respective word line voltage responses for the first and second segments during execution of the erase operation.

BRIEF DESCRIPTION OF THE DRAWINGS

Certain embodiments of the inventive concept will now be described in some additional detail with reference to the accompanying drawings.

DETAILED DESCRIPTION

Figure 1:
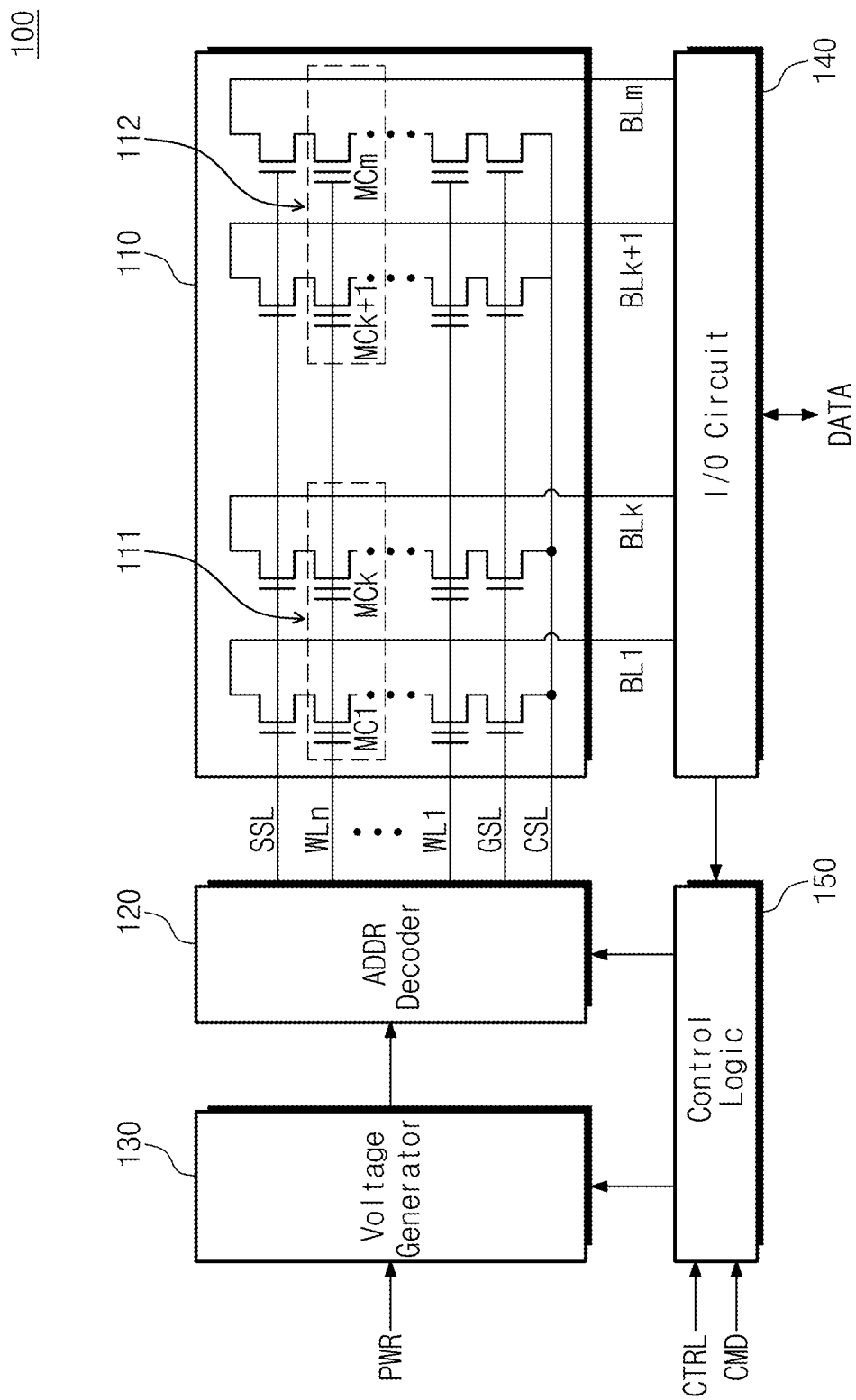
FIG. 1 is a block diagram illustrating a nonvolatile memory device in accordance with an embodiment of the inventive concept.

Embodiments of inventive concepts will now be described more fully hereinafter with reference to the accompanying drawings. This inventive concept may, however, be embodied in many different forms and should not be construed as being limited to only the illustrated embodiments. Rather, these embodiments are provided so that this disclosure will be thorough and complete, and will fully convey the scope of the inventive concept to those skilled in the art. In the drawings, like reference numbers and labels are used to denote like or similar elements.

For the written description that follows, a NAND flash memory device is assumed as a particular example of a broad class of nonvolatile memory devices to which the inventive concept pertains. For example, some of the nonvolatile memory devices presented contemplated by the inventive concept include not only a NAND flash memory, but also a vertical NAND flash memory (VNAND), a NOR flash memory, a resistive random access memory (RRAM), a phase-change memory (PRAM), a magneto-resistive random access memory (MRAM), a ferroelectric random access memory (FRAM), and a spin transfer torque random access memory (STT-RAM), etc. Certain embodiments of the inventive concept will include one or more nonvolatile memory device(s) having a three-dimensional (3D) memory cell array structure. The inventive concept further contemplates not only flash memory devices having a charge storage layer formed by a conductive floating gate but also a charge trap flash (CTF) having a charge storage layer formed by one or more insulating layer(s).

FIG. 1 is a block diagram illustrating a nonvolatile memory device in accordance with an embodiment of the inventive concept. Referring to FIG. 1, a nonvolatile memory device 100 includes a memory cell array 110, an address decoder 120, a voltage generator 130, an I/O circuit 140 and control logic 150.

Each page of the nonvolatile memory device 100, that is, memory cells connected to a respective word line are divided into a plurality of "segments" that may be distinguished by their respective disposition "distances" within the constituent memory cell array 1100 from the address decoder 120. With this configuration definition, the nonvolatile memory device 100 may detect whether or not each respective word line is a defective word line in relation to a program speed and/or an erase speed for each particular segment. In this manner, the nonvolatile memory device 100 may ensure the reliability of stored data by proactively determining defective word line(s) traversing the memory cell array 110.

The memory cell array 110 is assumed to include a plurality of memory blocks. Each memory block may have a 3D or vertical structure. That is, memory block may include structures that extend along first through third directions. In certain embodiments, each memory block includes a plurality of memory cell "strings". In FIG. 1, only one memory block is shown.

The memory cell array 110 is connected to the address decoder 120 via a plurality of word lines WL1~WLn, a ground select line GSL and a string select line SSL. The memory cell array 110 is connected to the input/output (I/O) circuit 140 via a plurality of bit lines BL1~BLm.

Given the foregoing "segment-designated" word line configuration, the memory cells connected to each word line are divided into a plurality of segments based on the respective distances from the address decoder 120. That is, in the embodiment of FIG. 1 the memory cells connected to the word line WLn are divided into two segments 111 and 112. However, this is just a simple illustration of many more segment-designation approaches that may be made for memory cells connected to one or more word lines in various embodiments of the inventive concept. For example, memory cells connected to the word line WLn in FIG. 1 might be divided into three or more segments in relation to different physical distances from the voltage generator 130 and/or the address decoder 120.

Here, the memory cells MC1~MCm constituting the first and second segments are driven by various word line voltages provided via the word line WLn. Each of the memory cells MC1~MCm may be configured as a single-level memory cell (SLC) capable of storing a single bit of data per memory cell, or as a multi-level memory cell (MLC) capable of storing two or more bits of data per memory cell.

The address decoder 120 selects any one among a plurality of memory blocks in response to an address. The address decoder 120 transmits word line voltages (e.g., a program voltage, a pass voltage, an erase voltage, a verification voltage, a read voltage, a read pass voltage, etc.) needed to drive the memory cells MC1~MCm.

The voltage generator 130 generates voltages needed to drive the memory cells MC1~MCm. The voltage generator 130 may include a high voltage generator to generate a high voltage, a low voltage generator to generate a low voltage, and/or a negative voltage generator to generate a negative voltage.

During a program operation, the I/O circuit 140 temporarily stores "write data" received from an external source, and thereafter loads the write data in a page to be written. During a read operation, the I/O circuit 140 receives "read data" from a corresponding page, temporarily stores the read data, and then outputs the read data to an external circuit. The I/O circuit 140 may include page buffers corresponding to the respective bit lines BL1~BLm. Each page buffer may include one latch that may be used to either temporarily store write data to be programmed in a memory cell connected to a corresponding bit line, or temporarily store read data received from a memory cell connected to a corresponding bit line.

The control logic 150 controls the overall operation of the nonvolatile memory device 100. The control logic 150 decodes certain externally provided control signal(s) CTRL and/or command(s) CMD. The control logic 150 controls the operation of and the interoperation between the address decoder 120, voltage generator 130, and I/O circuit 140.

The control logic 150 controls the voltage generator 130 such that the voltage generator 130 generates various voltages required to execute program, read, and/or erase operation(s) by the nonvolatile memory device 100. The control logic 150 also controls the address decoder 120 such that the generated voltages are communicated to one or more selected word line among word lines WL1~WLn. The control logic 150 also controls the operation I/O circuit 140 in order to output a designated page of read data or program a designated page of write data.

In certain embodiments of the inventive concept, the control logic 150 may also be used to determine whether or not one or more word lines of the nonvolatile memory device 100 are defective. This determination may be made in relation to one or more defect-identifying conditions. For example, one type of defect-identifying condition may be the receipt of a particular command from an external source. In response to such a command, the control logic 150 may cause execution of a "defective word line detection operation" that causes the execution of at least one program operation, and/or at least one erase operation, for example. One example of this approach is described in some additional detail with reference to FIG. 4.

During a defective word line detection operation, the control logic 150 is able to determine whether or not a word line is defective in relation to a program speed and/or an erase speed for one or more segments of a selected word line. One example of a defective word line detection operation will be described in some additional detail with reference to FIGS. 5, 6, 7, 8, and 9.

As the result of a defective word line detection operation, the control logic 150 may provide "defective word line information" associated with one or more word lines to an external circuit, such as for example, a controller. Further, the control logic 150 can cause execution of a copy back operation for data stored by memory cells connected to word lines deemed to be defective by the defective word line detection operation, and thereafter prohibit the use of a word line deemed to be defective.

Figure 2:
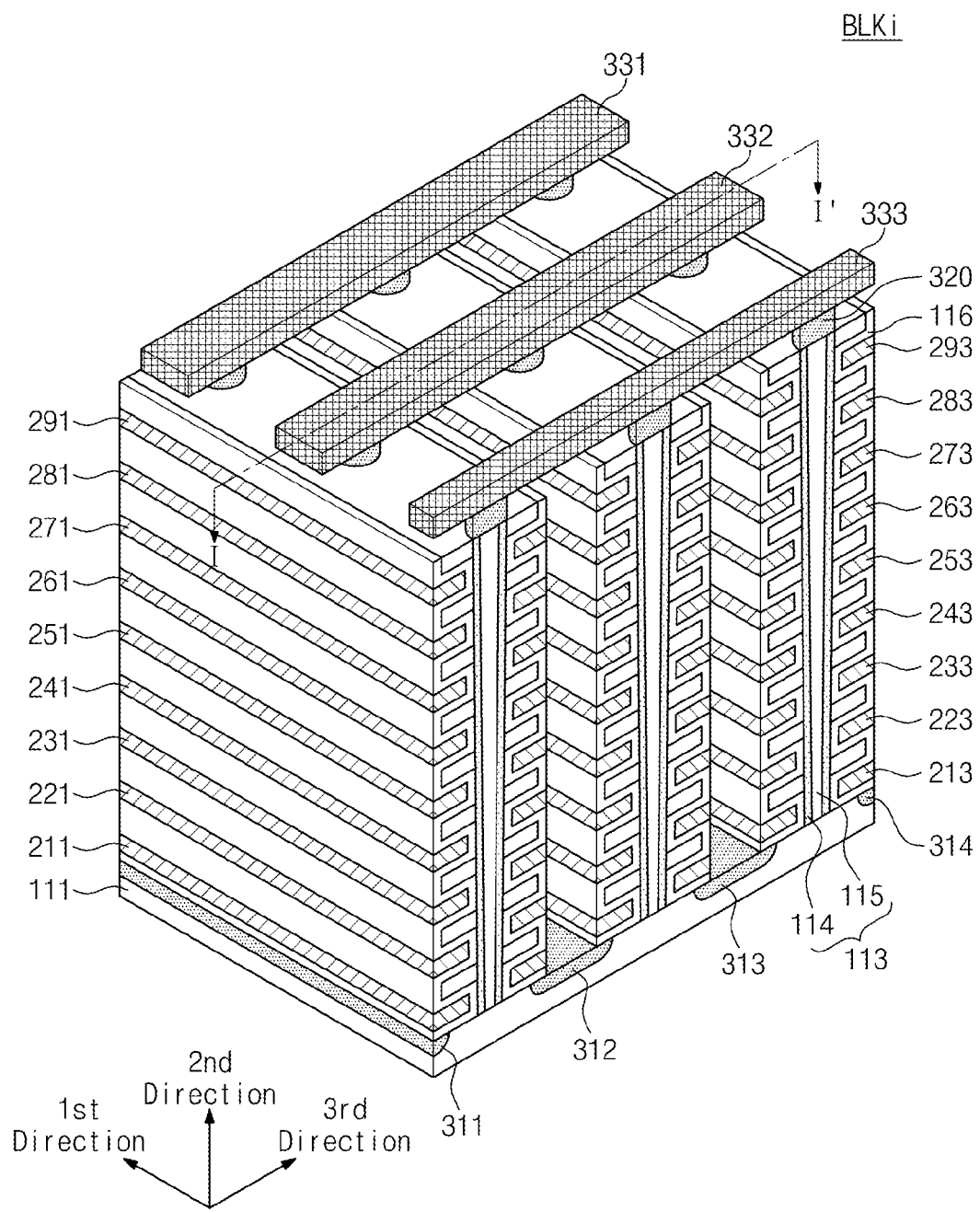
FIG. 2 is a perspective view further illustrating one example of a memory block that may be included in the memory cell array of FIG. 1.
Figure 3:
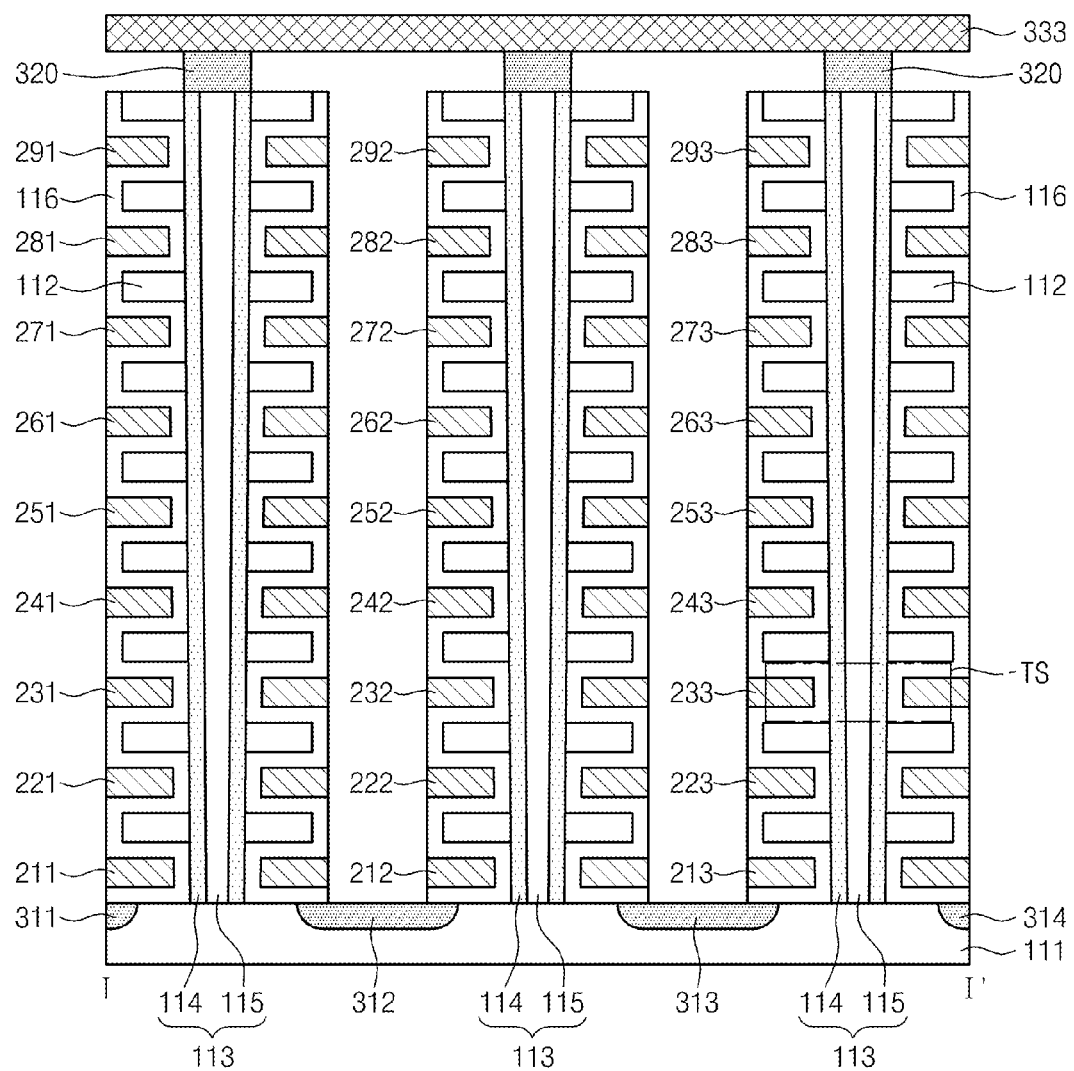
FIG. 3 is a cross sectional view taken along the line I-I' of the memory block in FIG. 2.

FIG. 2 is a perspective view further illustrating in one example a memory block that may be included in the memory cell array of FIG. 1. FIG. 3 is a cross sectional view taken along the line I-I' of the memory block of FIG. 2. Referring collectively to FIGS. 2 and 3, a memory block BLKi includes constituent structures that extend in first, second and third directions.

A substrate 111 is provided. The substrate 111 includes silicon material doped with a first type impurity, for example, a p-type impurity. For example, the substrate 111 is a p-type well (e.g., a pocket well). The substrate 111 may further include an n-type well surrounding the p-type well. It is assumed that the substrate 111 is p-type silicon. However, the substrate 111 is not limited to p-type silicon.

A plurality of doping regions 311~314 that extends in a first direction is provided. The doping regions 311~314 have a second type different from the substrate 111. The doping regions 311~314 have an n-type. It is assumed that first through fourth doping regions 311~314 are an n-type. However, the first through fourth doping regions 311~314 are not limited to an n-type.

A plurality of insulating materials 112 extending along the first direction is sequentially provided along the second direction on an area of the substrate 111 between the first and second doping regions 311 and 312. The insulating materials 112 are provided to be spaced a predetermined distance apart from the substrate 111 along the second direction. The insulating materials 112 include an insulating material such as silicon oxide.

A plurality of pillars 113 which is sequentially disposed along the first direction and penetrates the insulating materials 112 along the second direction is provided on an area of the substrate 111 between the first and second doping regions 311 and 312. The pillars 113 penetrate the insulating materials 112 to be connected to the substrate 111.

Each pillar 113 is constituted by a plurality of materials. A surface layer 114 of each pillar 113 includes silicon material doped with a first type. The surface layer 114 of each pillar 113 includes silicon material doped with the same type as the substrate 111. It is assumed that the surface layer 114 of each pillar 113 includes p-type silicon. However, the surface layer 114 of each pillar 113 is not limited to include p-type silicon.

An internal layer 115 of each pillar 113 is constituted by an insulating material. For example, an internal layer 115 of each pillar 113 includes an insulating material such as silicon oxide.

An insulating layer 116 is provided along an exposed surface of the insulating materials 112, the pillars 113 and the substrate 111. A thickness of the insulating layer 116 is smaller than half a distance between the insulating materials 112. An area is provided in which material besides the insulating materials 112 and the insulating layer 116 can be disposed between the insulating layer 116 provided on a bottom surface of the first insulating layer among the insulating materials 112 and the insulating layer 116 provided on a top surface of the second material below the first insulating material among the insulating materials 112.

Conductive materials 211~291 are provided on an exposed surface of the insulating layer 116 on an area between the first and second doping regions 311 and 312. For example, the conductive material 211 extending along the first direction is provided between the substrate 111 and the insulating material 112 adjacent to the substrate 111. The conductive material 211 extending along the first direction is provided between the substrate 111 and the insulating layer 116 of a bottom surface of the insulating material 112 adjacent to the substrate 111.

A conductive material extending along the first direction is provided between the insulating layer 116 on a tope surface of a specific insulating material among the insulating materials 112 and the insulating layer 116 on a bottom surface of an insulating material disposed over the specific insulating material. In embodiments, a plurality of conductive materials 221~281 extending in the first direction is provided between the insulating materials 112. A conductive material 291 extending in the first direction is provided onto the insulating materials 112. The conductive materials 211~291 extending in the first direction are a metal material. The conductive materials 211~291 extending in the first direction are conductive materials such as poly silicon.

The same structure as the structure on an area of the substrate 111 between the first and second doping regions 311 and 312 is provided on an area of the substrate 111 between the second and third doping regions 312 and 313. A plurality of insulating materials 112 extending in the first direction, a plurality of pillars 113 which is sequentially disposed along the first direction and penetrates the insulating materials 112 along the third direction, an insulating layer 116 provided on an exposed surface of the insulating materials 112 and the pillars 113, and a plurality of conductive materials 212~292 extending along the first direction are provided on an area of the substrate 111 between the second and third doping regions 312 and 313.

The same structure as the structure on an area of the substrate 111 between the first and second doping regions 311 and 312 is provided on an area of the substrate 111 between the third and fourth doping regions 313 and 314. A plurality of insulating materials 112 extending in the first direction, a plurality of pillars 113 which is sequentially disposed along the first direction and penetrates the insulating materials 112 along the third direction, an insulating layer 116 provided on an exposed surface of the insulating materials 112 and the pillars 113, and a plurality of conductive materials 213~293 extending along the first direction are provided on an area of the substrate 111 between the second and third doping regions 313 and 314.

Drains 320 are provided on the pillars 113 respectively. The drains 320 are silicon materials doped with a second type. For example, the drains 320 are silicon materials doped with an n-type. It is assumed that the drains 320 include n-type silicon. However, the drains 320 are not limited to include n-type silicon. A width of each drain 320 may be greater than a width of a corresponding pillar 113. Each drain 320 may be provided on a top surface of a corresponding pillar 113 in the form of a pad.

Conductive materials 331~333 extending in the third direction are provided on the drains 320. The conductive materials 331~333 are sequentially disposed along the first direction. The conductive materials 331~333 are connected to the respective drains 320. The conductive materials 331~333 can be connected to the drains 320 through contact plugs. The conductive materials 331~333 extending in the third direction are metal materials. The conductive materials 331~333 extending in the third direction are conductive materials such as poly silicon.

In FIGS. 2 and 3, each pillar 113 forms a string ST together with an adjacent area of the insulating layer 116 and an adjacent area among the conductive materials (211~291, 212~292, 213~293). The string ST includes a plurality of transistor structures TS.

Figure 4:
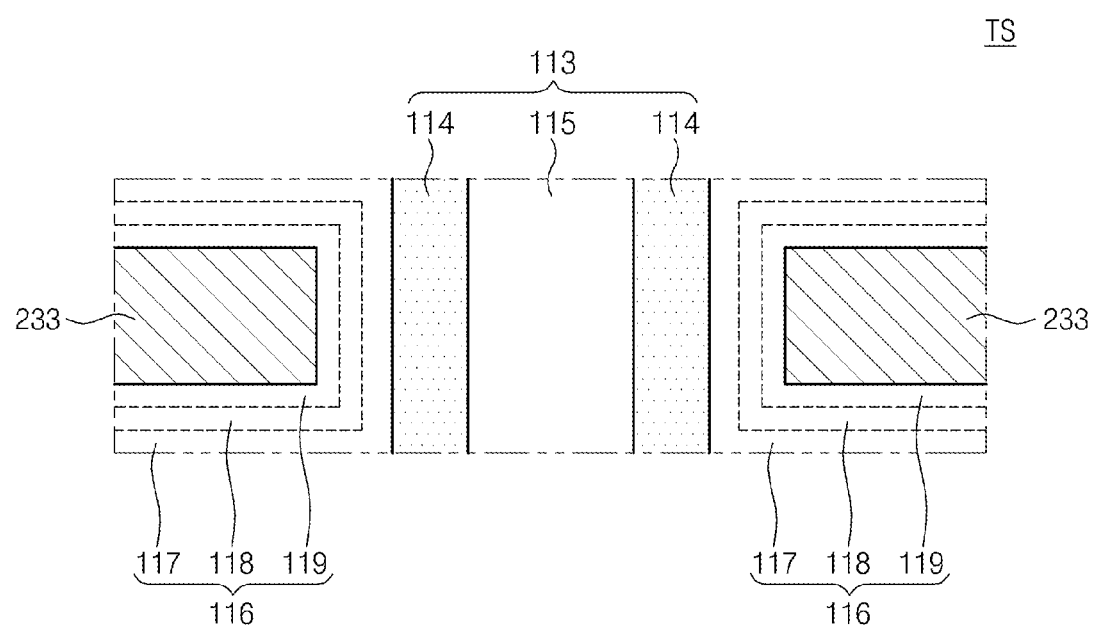
FIG. 4 is a cross sectional view illustrating in one example of a transistor structure that may be used in relation to the memory cells of FIGS. 3 and 4.

FIG. 4 is a cross sectional view illustrating one example of a transistor structure TS that may be used in conjunction with the memory cells of FIGS. 2 and 3. Referring to FIGS. 2, 3 and 4, the insulating layer 116 includes first through third sub insulating layers 117, 118 and 119.

P-type silicon 114 of the pillar 113 operates as a body. The first sub insulating layer 117 adjacent to the pillar 113 operates as a tunneling insulating layer. The first sub insulating layer 117 adjacent to the pillar 113 includes a thermal oxide layer.

The second sub insulating layer 118 operates as a charge storage layer. For example, the second sub insulating layer 118 operates as a charge capturing layer. The second sub insulating layer 118 includes a nitride layer or a metal oxide layer (e.g., an aluminum oxide layer, a hafnium oxide layer, etc.).

The third sub insulating layer 119 adjacent to the conductive material 233 operates as a blocking layer. The third sub insulating layer 119 adjacent to the conductive material 233 extending in the first direction may be formed in a single layer or a multilayer. The third sub insulating layer 119 may be a high dielectric layer (e.g., an aluminum oxide layer, a hafnium oxide layer) having a dielectric constant higher than the first and second sub insulating materials 117 and 118.

The conductive material 233 operates as a gate (or a control gate). The gate 233 (or a control gate), the blocking insulating layer 119, the tunneling insulating layer 117 and the body 114 form a transistor (or a memory cell transistor structure). The first through third sub insulating layers 117~119 can embody an oxide-nitride-oxide (ONO). The p-type silicon 114 of the pillar 113 is referred to as a second directional body.

A memory block BLKi of FIGS. 2, 3, and 4 includes a plurality of pillars 113. The memory block BLKi includes a plurality of strings ST. The memory block BLKi includes a plurality of strings ST extending in the second direction (or a direction perpendicular to the substrate).

Each string ST includes a plurality of transistor structures ST disposed along the second direction. At least one of the transistor structures ST of each string ST operates as a string select transistor SST. At least one of the transistor structures ST of each string ST operates as a ground select transistor GST.

Gates (or control gates) correspond to the conductive materials (211~291, 212~292, 213~293) extending in the first direction. That is the gates (or control gates) extend in the first direction to form word lines and at least two select lines (for example, at least one string select line SSL and at least one ground select line GSL).

The conductive materials 331~333 extending in the third direction are connected to one ends of the strings ST. The conductive materials 331~333 extending in the third direction operate as bit lines BL. That is, one memory block BLKi, a plurality of strings is connected to one bit line BL.

The second type doping regions 311~314 extending in the first direction are provided to the other ends of the strings ST. The second type doping regions 311~314 extending in the first direction operate as common source lines CSL.

The memory block BLKi includes a plurality of strings extending in a direction perpendicular to the substrate 111 (the second direction) and operates as a NAND flash memory block (for example, a charge capturing type) that a plurality of strings ST is connected to one bit line BL.

The foregoing written description makes clear that certain conductive materials (e.g., 211~291, 212~292, 213~293) used in the fabrication of a 3D memory cell array may extend in the various directions and be disposed in multiple layers. Those skilled in the art will understand, however, that the designation of material layout direction(s) is matter of arbitrary discretion, and that the number of layers (e.g., 8 layers, 16 layers, etc.) used to form a 3D memory cell array may vary—so long as a string includes at least two transistors.

In FIGS. 2, 3 and 4, three strings ST are connected to one bit line BL. But this is just one example of many possible bit line BL connections. In the memory block BLKi, "m" strings ST may be connected to one bit line BL. The number of the conductive materials (211~291, 212~292, 213~293) and the common source lines 311~314 depends on the number of the strings ST connected to one bit line BL.

Figure 5:
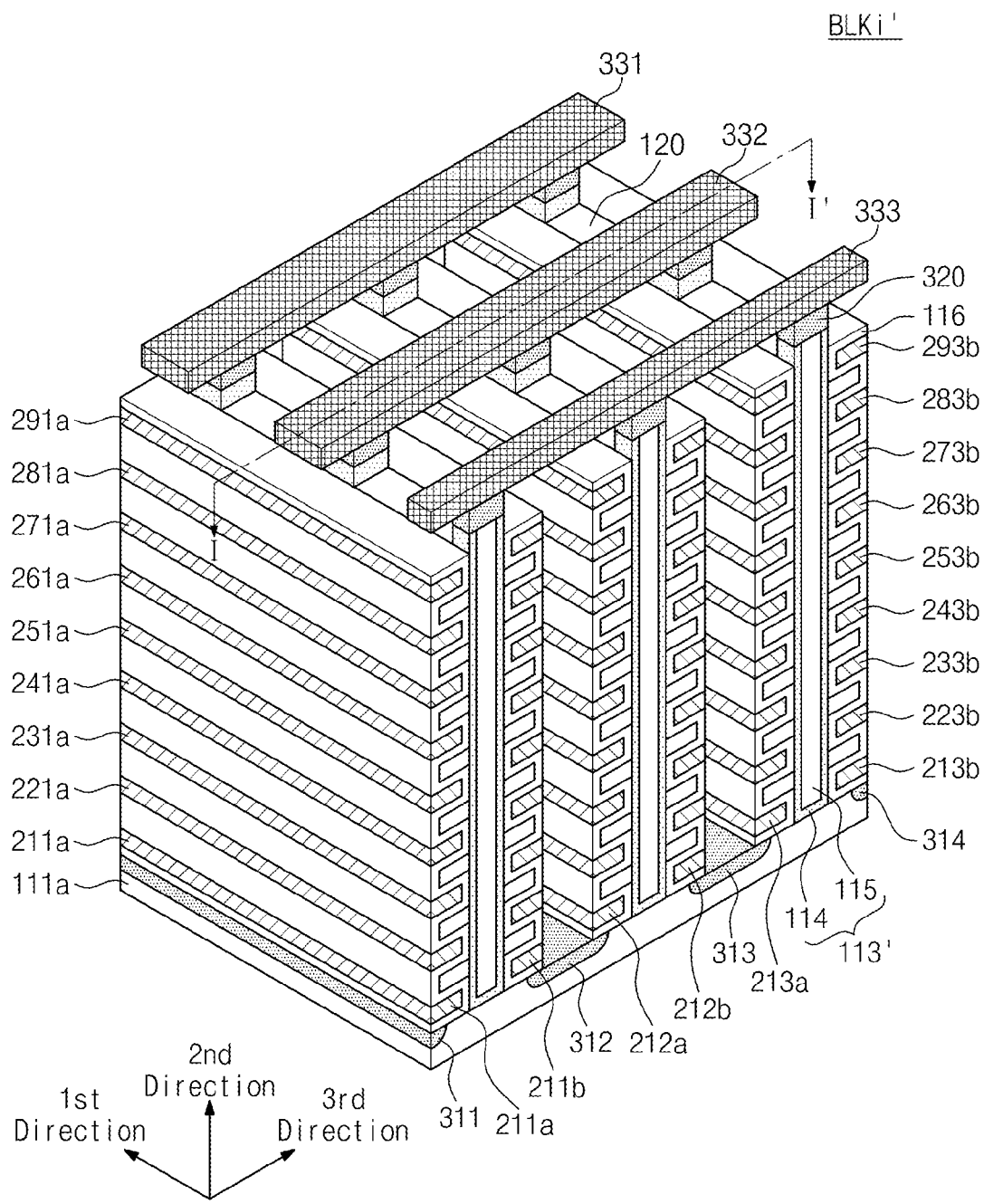
FIGS. 5 and 6 are perspective views further illustrating additional respective examples of a memory block that may be included in the memory cell array of FIG. 1.

FIG. 5 is a perspective view illustrating another example of a memory block BLKi' that may be included in the memory cell array of FIG. 1. Here, pillars 113' in a memory block BLKi' are provided in the form of a square pillar as compared with the memory block BLKi illustrated in FIG. 2. Insulating materials 120 are provided between the pillars 113' disposed along the first direction.

The insulating materials 120 extend along the second direction to be connected to a substrate 111a. The insulating materials 120 also extend along the +first direction in areas except areas to which the pillars 113' are provided. The conductive materials (211~291, 212~292, 213~293) described with reference to FIG. 2 are divided into two parts (211a~291a, 211b~291b, 212a~292a, 212b~292b, 213a~293a, 213b~293b) respectively. The divided parts (211a~291a, 211b~291b, 212a~292a, 212b~292b, 213a~293a, 213b~293b) are electrically isolated from one another.

On an area of the substrate 111a between the doping regions 312 and 313, each pillar 313' forms one string ST together with one part 211a~291a and the insulating layer 116 that extend in the first direction and another string ST together with the other part 211b~291b and the insulating layer 116 that extend in the first direction.

On an area of the substrate 111a between the doping regions 312 and 313, each pillar 313' forms one string ST together with one part 212a~292a and the insulating layer 116 that extend in the first direction and another string ST together with the other part 212b~292b and the insulating layer 116 that extend in the first direction.

On an area of the substrate 111a between the doping regions 313 and 314, each pillar 313' forms one string ST together with one part 213a~293a and the insulating layer 116 that extend in the first direction and another string ST together with the other part 213b~293b and the insulating layer 116 that extend in the first direction.

By electrically isolating conductive materials (211a~291a, 211b~291b) being provided on both sides of each pillar 113' using the insulating layer 120, each pillar 113' can form two strings ST.

Figure 6:
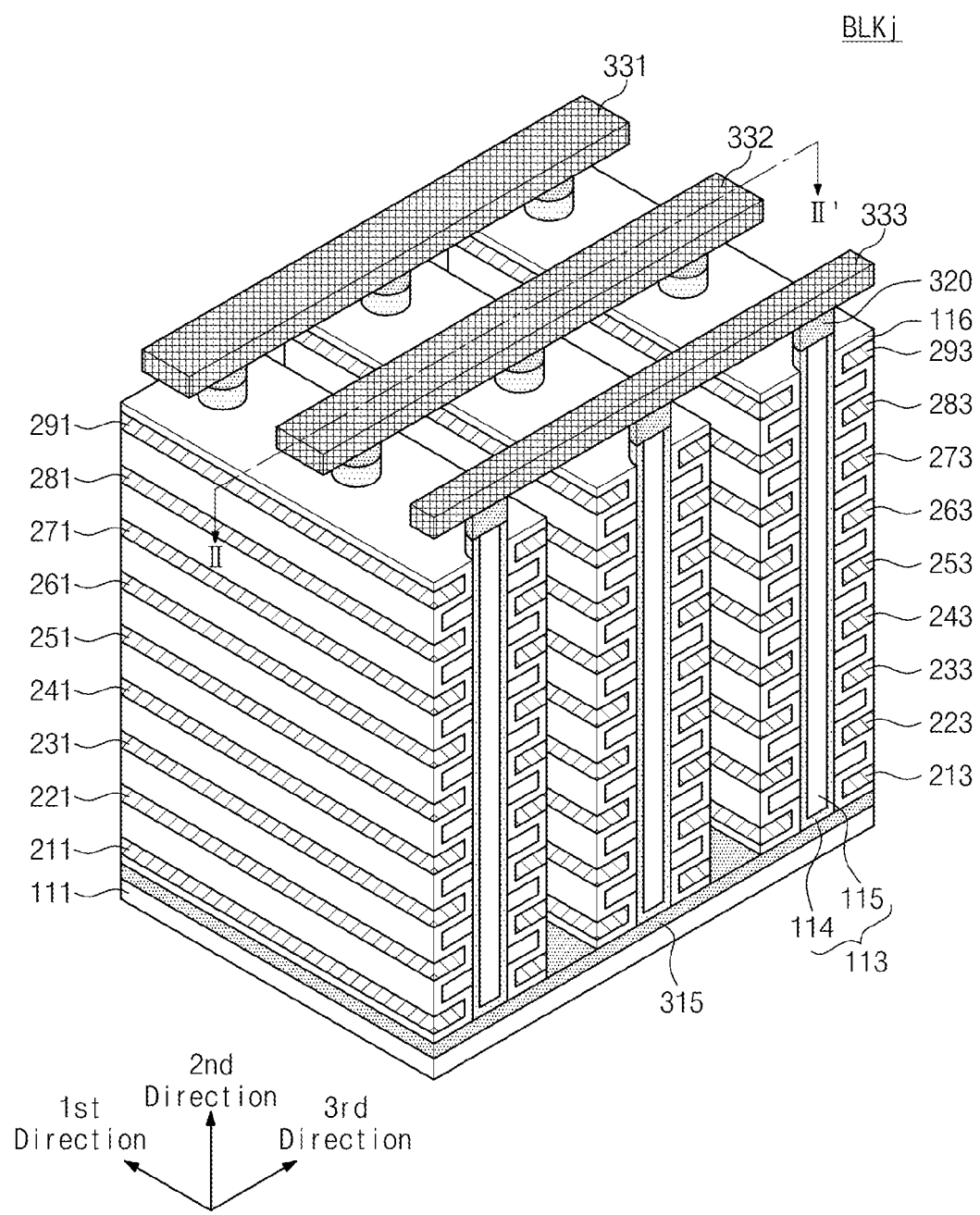
Figure 7:
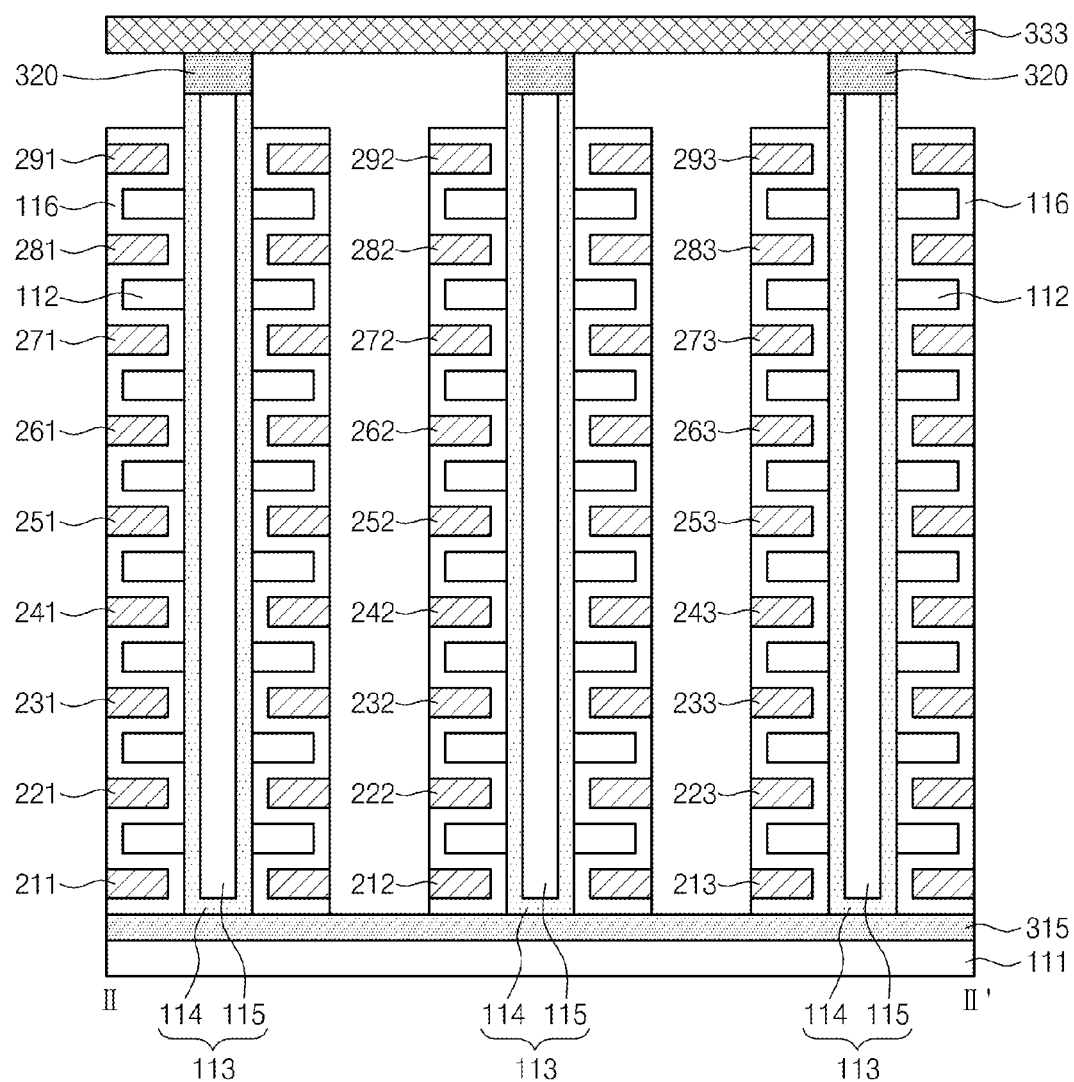
FIG. 7 is a cross sectional view taken along the line II-II' of the memory block in FIG. 6.

FIG. 6 is a perspective view illustrating still another example of a memory block BLKj that may be included in the memory cell array of FIG. 1. FIG. 7 is a cross sectional view taken along the line II-II' of the memory block BLKj illustrated in FIG. 6. Referring to FIGS. 6 and 7, a memory block BLKj is essentially embodied as described with reference to FIGS. 2 and 5, except that a second type doping region 315 on a substrate 111 is provided in the form of a plate.

Figure 8:
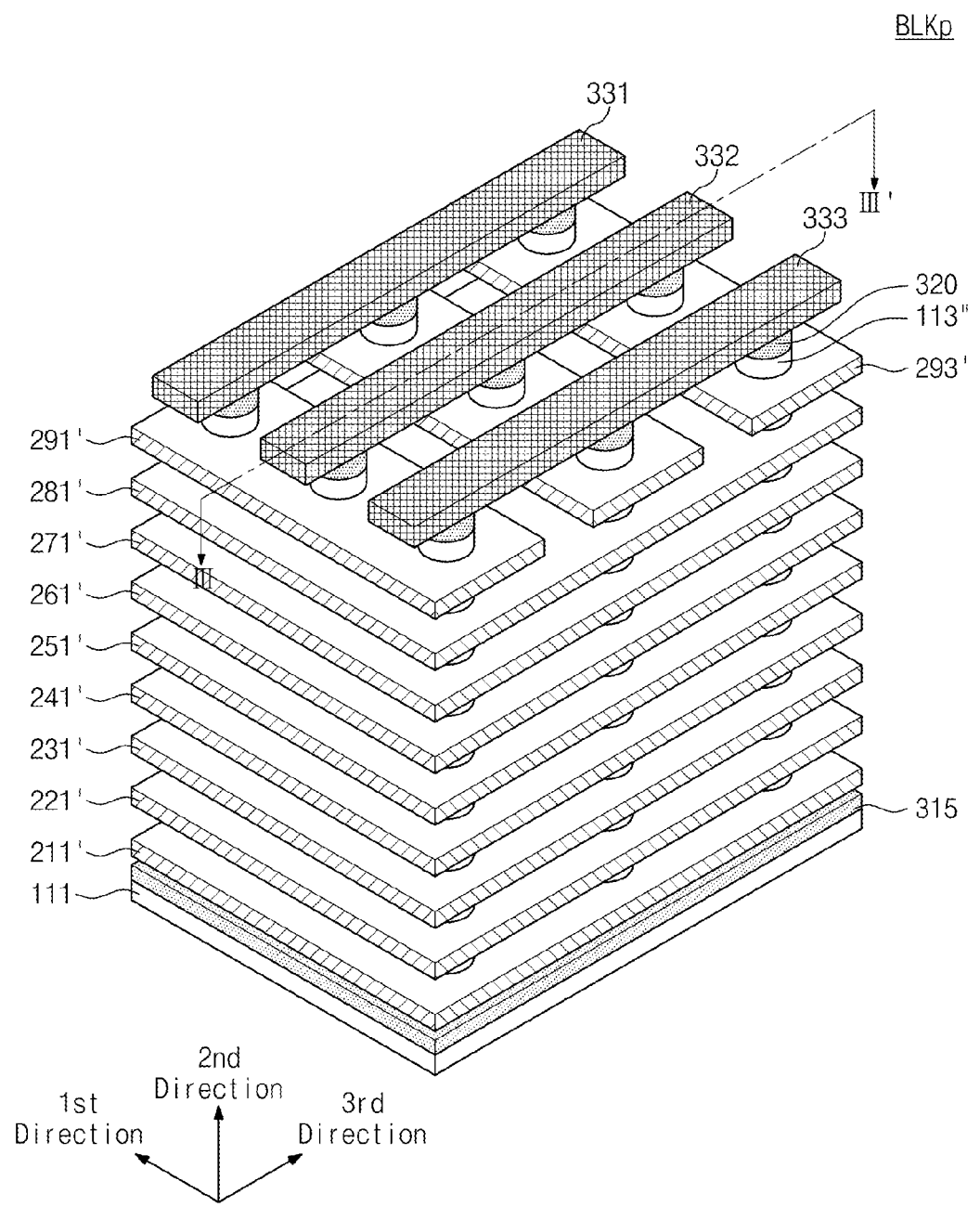
FIG. 8 is a perspective view further illustrating yet another example of a memory block that may be included in the memory cell array of FIG. 1.
Figure 9:
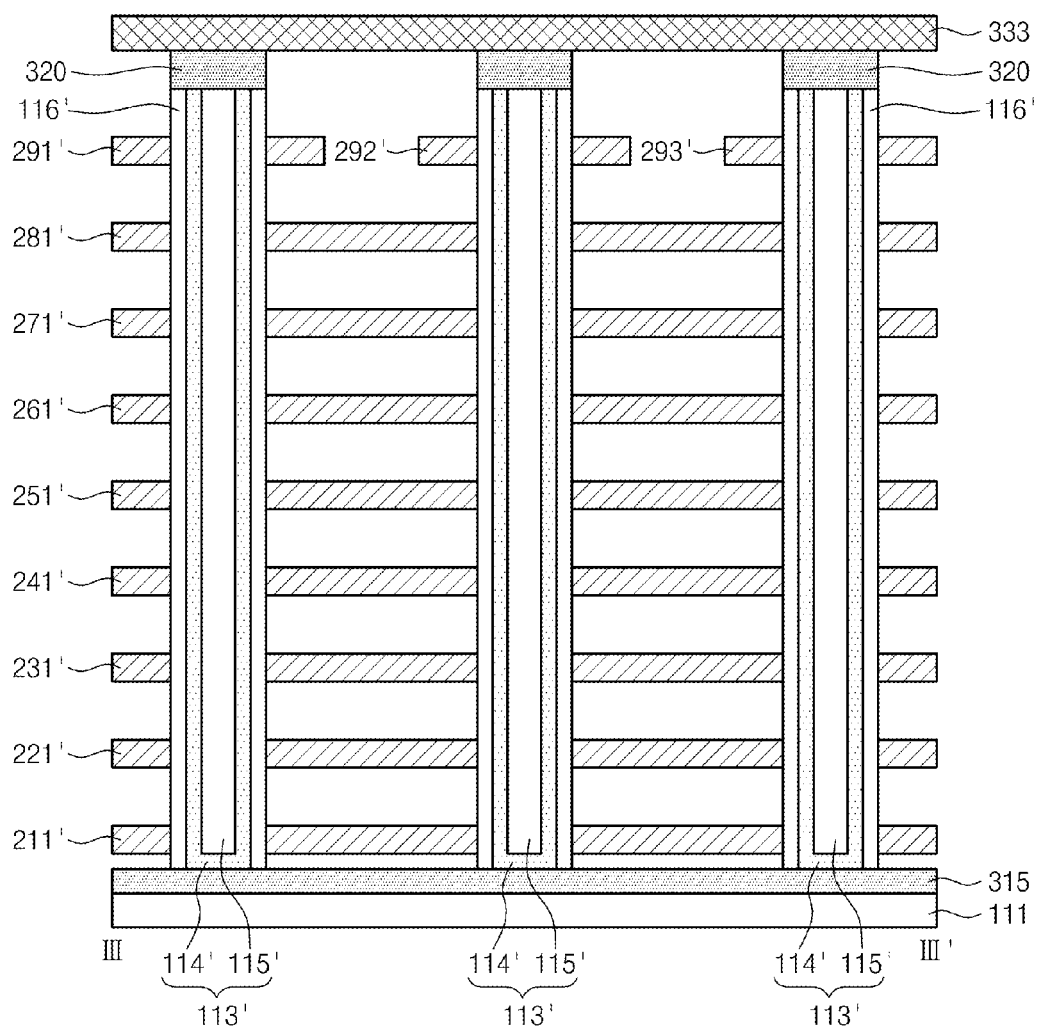
FIG. 9 is a cross sectional view taken along the line III-III' of the memory block in FIG. 8.

FIG. 8 is a perspective view illustrating yet another example of a memory block BLKp that may be included in the memory cell array of FIG. 1. FIG. 9 is a cross sectional view taken along the line III-III' of the memory block illustrated in FIG. 8.

Referring to FIGS. 8 and 9, a second type doping region 315 of a plate form is provided on a substrate 111. Conductive materials 221'~281' are provided in the form of a plate. An insulating layer 116' is provided on a surface layer of a pillar 113'. A middle layer 114' of the pillar 113' includes p-type silicon. The middle layer 114' of the pillar 113' operates as a body. An internal layer 115' of the pillar 113' includes insulating material.

Figure 10:
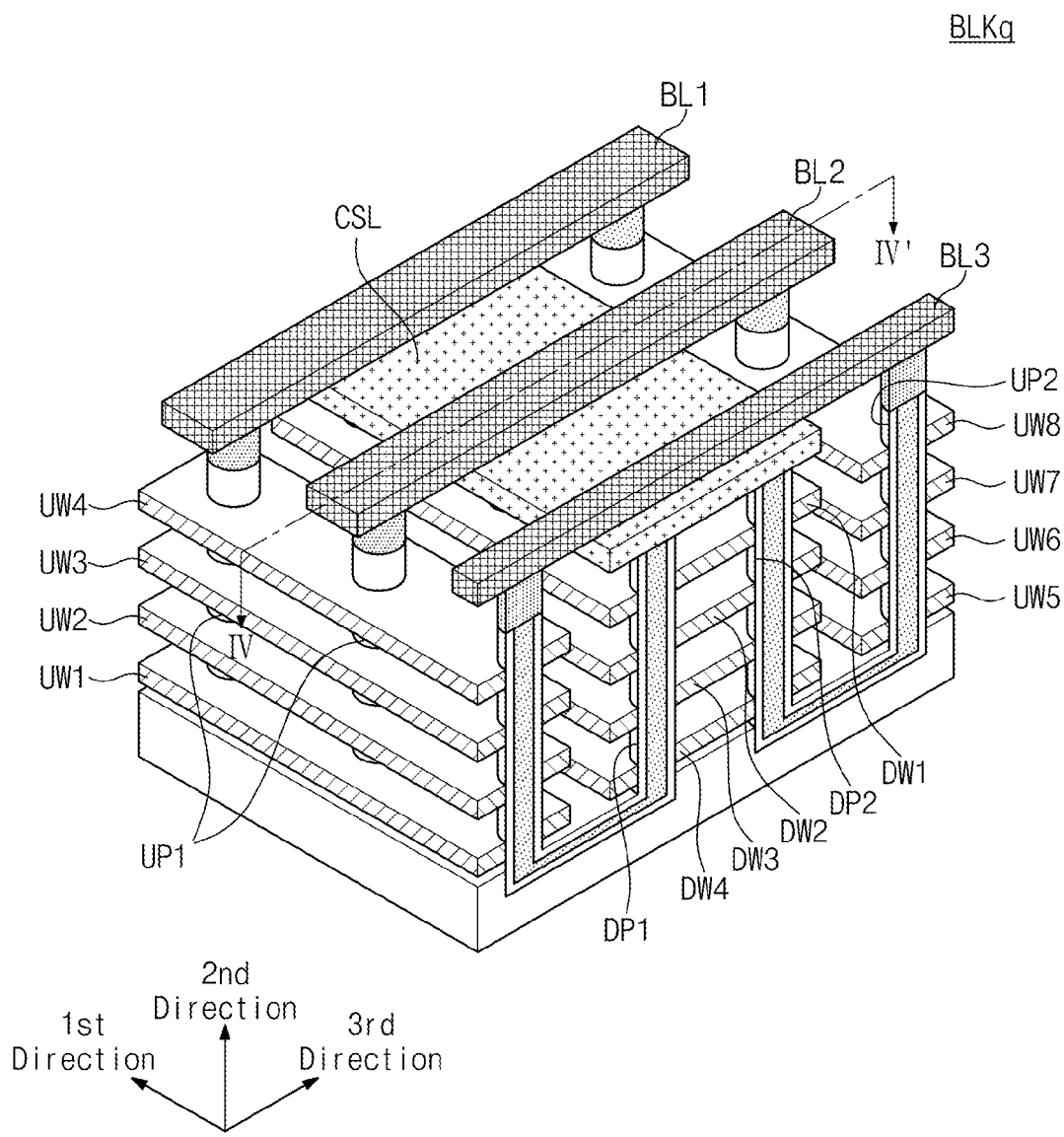
FIG. 10 is a perspective view further illustrating still another example of a memory block that may be illustrated in the memory cell array of FIG. 1.
Figure 11:
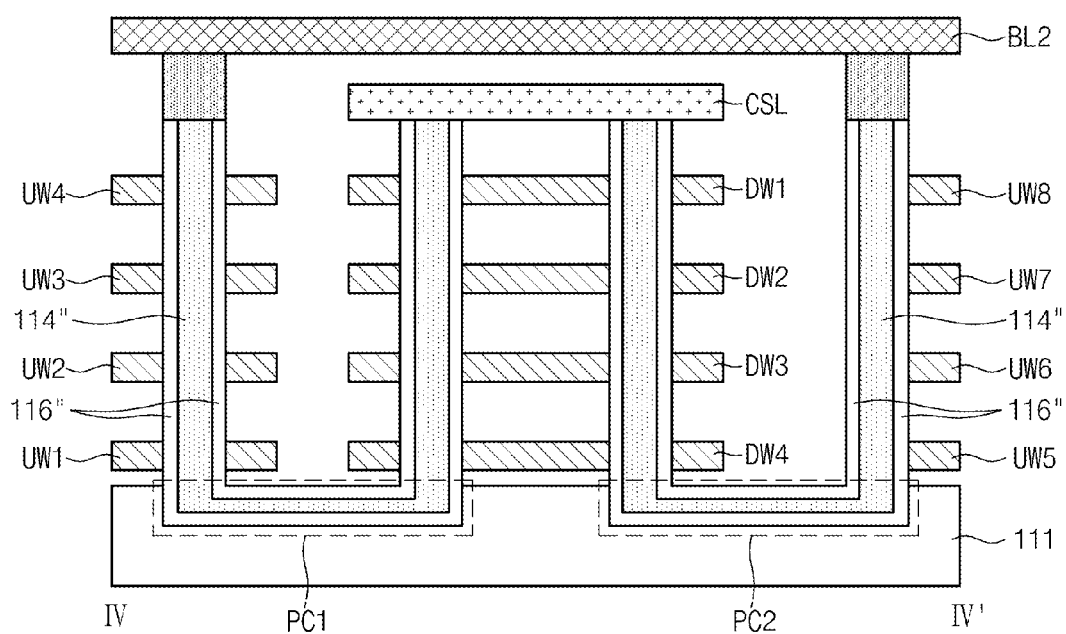
FIG. 11 is a cross sectional view taken along the line IV-IV' of the memory block in FIG. 10.

FIG. 10 is a perspective view illustrating still another example of a memory block BLKq that may be included in the memory cell array of FIG. 1. FIG. 11 is a cross sectional view taken along the line IV-IV' of the memory block BLKq illustrated in FIG. 10.

Referring to FIGS. 10 and 11, first through fourth upper word lines UW1~UW4 extending in the first direction are sequentially provided on a substrate 111 along the second direction. The first through fourth upper word lines UW1~UW4 are provided to be spaced a distance previously set apart from one another along the second direction. First upper pillars UP1 are provided which are sequentially disposed along the first direction and penetrate the first through fourth upper word lines UW1~UW4 along the second direction.

First through fourth lower word lines DW1~DW4 extending along the first direction are sequentially provided on a substrate along the second direction. The first through fourth lower word lines DW1~DW4 are provided to be spaced a distance previously set apart from one another along the second direction. First lower pillars DP1 are provided which are sequentially disposed along the first direction and penetrate the first through fourth lower word lines DW1~DW4 along the second direction. Second lower pillars DP2 are provided which are sequentially disposed along the first direction and penetrate the first through fourth lower word lines DW1~DW4 along the second direction. The first and second lower pillars DP1 and DP2 may be disposed in parallel to one another along the second direction.

Fifth through eighth upper word lines UW5~UW8 extending in the first direction are sequentially provided on a substrate 111 along the second direction. The fifth through eighth upper word lines UW5~UW8 are provided to be spaced a distance previously set apart from one another along the second direction. Second upper pillars UP2 are provided which are sequentially disposed along the first direction and penetrate the fifth through eighth upper word lines UW5~UW8 along the second direction.

A common source line CSL extending in the first direction is provided on top surfaces of the first and second lower pillars DP1 and DP2. The common source line CSL is n-type silicon. When the common source line CSL is embodied by conductive material not having a polarity like metal or poly silicon, n-type sources may be further provided between the common source line CSL, and the first and second lower pillars DP1 and DP2. The common source line CSL and the first and second lower pillars DP1 and DP2 can be connected to each other through contact plugs respectively.

Drains 320 are provided on top surfaces of the first and second upper pillars UP1 and UP2. The drains 320 are n-type silicon. A plurality of bit lines BL1~BL3 extending the third direction is sequentially provided on top surfaces of the drains 320 along the first direction. The bit lines BL1~BL3 are embodied by metal. The bit lines BL1~BL3 and the drains 320 can be connected to one another through contact plugs.

Each of the first and second upper pillars UP1 and UP2 includes a surface layer 116" and an internal layer 114". Each of the first and second lower pillars DP1 and DP2 includes a surface layer 116" and an internal layer 114". The surface layer 116" includes a block insulating layer, a charge storage layer and a tunneling insulating layer.

The tunneling layer includes a thermal oxide layer. The charge storage layer includes a nitride layer or a metal layer (e.g., an aluminum oxide layer, a hafnium oxide layer). The blocking insulating layer may be a high dielectric layer (e.g., an aluminum oxide layer, a hafnium oxide layer) having a dielectric constant higher than the tunnel insulating layer 117 and the charge storage layer 118. The tunnel insulating layer 117, the charge storage layer 118 and the blocking insulating layer 119 can embody an oxide-nitride-oxide (ONO).

The internal layer 114" is p-type silicon. The internal layer 114" operates as a body.

The first upper pillars UP1 and the first lower pillars DP1 are connected to one another through first pipeline contacts PC1. The surface layers 116" of the first upper pillars UP1 and the first lower pillars DP1 are connected to one another through surface layers of the first pipeline contacts PC1. The surface layers of the first pipeline contacts PC1 are embodied by the same material as the surface layers 116" of the first upper pillars UP1 and the first lower pillars DP1.

The internal layers 114" of the first upper pillars UP1 and the first lower pillars DP1 are connected to one another through internal layers of the first pipeline contacts PC1. The internal layers of the first pipeline contacts PC1 are embodied by the same material as the internal layers 114" of the first upper pillars UP1 and the first lower pillars DP1.

The first upper pillars UP1 and the first through fourth upper word lines UW1~UW4 form first upper strings and the first lower pillars DP1 and the first through fourth lower word lines DW1~DW4 form first lower strings. The first upper strings and the first lower strings are connected to one another through the first pipeline contacts PC1. The drains 320 and the bit lines BL1~BL3 are connected to one ends of the first upper strings. The common source line CSL is connected to one ends of the first lower strings. That is, the first upper strings and the first lower strings form a plurality of strings connected between the bit lines BL1~BL3 and the common source line CSL.

Similarly, the second upper pillars UP2 and the fifth through eighth upper word lines UW5~UW8 form second upper strings and the second lower pillars DP2 and the first through fourth lower word lines DW1~DW4 form second lower strings. The second upper strings and the second lower strings are connected to one another through second pipeline contacts PC2. The drains 320 and the bit lines BL1~BL3 are connected to one ends of the second upper strings. The common source line CSL is connected to one ends of the second lower strings. That is, the second upper strings and the second lower strings form a plurality of strings connected between the bit lines BL1~BL3 and the common source line CSL.

An equivalent circuit of the memory block BLKq is the same as the memory block BLKi of FIG. 2 except that 8 transistors are provided to one string and 2 strings are connected to the first through third bit lines BL1~BL3 respectively. However, the number of word lines, bit lines and strings of the memory block BLKq is not limited.

First and second pipeline contact gates (not shown) may be provided to form a channel in the bodies 114" of the first and second pipeline contacts PC1 and PC2. The first and second pipeline contact gates are provided on surfaces of the first and second pipeline contacts PC1 and PC2.

Adjacent lower pillars DP1 and DP2 share the lower word lines DW1~DW4. However, when adjacent upper pillars are added to the upper pillars (UP1 or UP2), the adjacent upper pillars can be embodied to share the upper word lines (UW1~UW4 or UW5~UW8).

Figure 12:
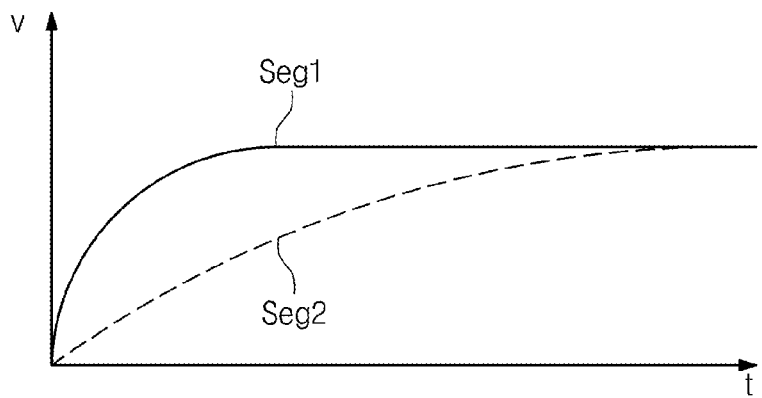
FIG. 12 is a graph showing voltage change over time for a first segment in relation to voltage change over time for a second segment of a word line.

FIG. 12 is a graph showing a voltage change (v) over time (t) for the first segment 111 and second segment 112 of FIG. 1. Referring to FIG. 12, the speed with which the second segment achieves (or charges to) a given word line voltage level—assuming the second segment 112 is located farther from the voltage generator 130 and address decoder 120 than the first segment 111—is much slower that the speed with which the first segment 111 achieves the same word line voltage level. Where such a condition is detected, it may be reasonably assumed that a resistive defect exists in the selected word line, and that such the resistive defect is causing the noted differences in word line voltage charging speed between the first and second segments 111/112. Hereafter, this phenomenon will be termed a "word line voltage response", or a "word line charging speed".

It should also be noted that a corresponding difference will usually be apparent in the respective program speeds for memory cells associated with the first and second segments due to the different word line voltage responses. That is, a segment exhibiting a slower word line voltage response will be programmed at a lower speed, as compared with other segments having faster word line voltage responses. Thus, the control logic 150 may be used to detect material difference(s), if any, between word line voltage responses for respective segments and then use this information to determine whether or not a resistive defect exists in the selected word line.

Figure 13:
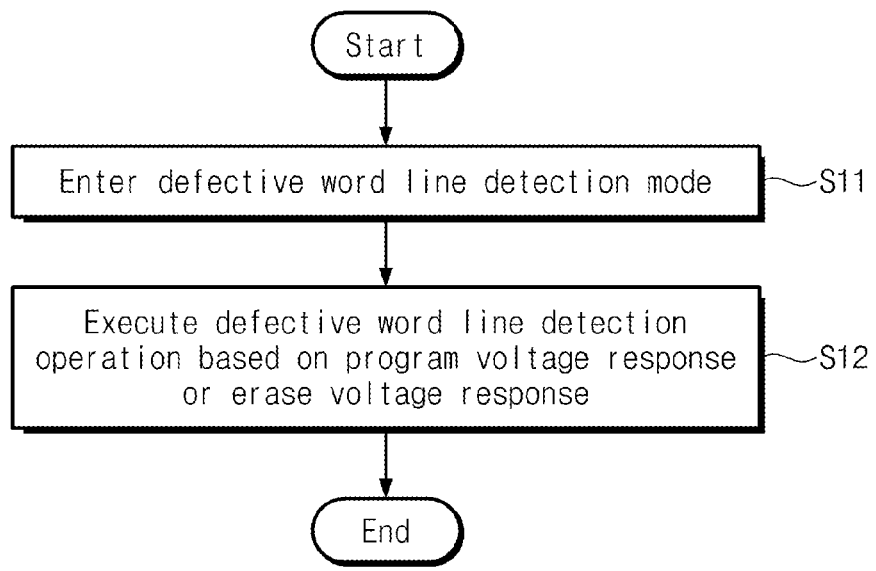
FIG. 13 is a general flow chart summarizing a method of detecting a defective word line in a nonvolatile memory device.

FIG. 13 is a general flow chart summarizing a method of detecting a defective word line within a nonvolatile memory device according to the inventive concept. With reference to FIGS. 1 and 3, the illustrated method is capable of detecting the presence of a defective word line in the nonvolatile memory device 100 in relation to (1) a program voltage response, and/or (2) a an erase voltage response for the selected word line.

Thus, the nonvolatile memory device 100 enters a defective word line detection mode (S11). The nonvolatile memory device 100 may enter the defective word line detection mode in response to one or more defect-identifying condition(s), and may determine whether a single word line is defective, or whether each word line in a group of sequentially checked word lines are defective.

Once in the defective word line detection mode, a defective word line detection operation is executed based on (e.g.,) a program voltage response and/or an erase voltage response for a selected word line (S12). Accordingly, for defined segments of a selected word line, materially different word line voltage responses (e.g., charging responses to an applied program voltage and/or an applied erase voltage) may be considered, and a determination may be made as to whether or not the selected word line is defective in view of same.

Figure 14:
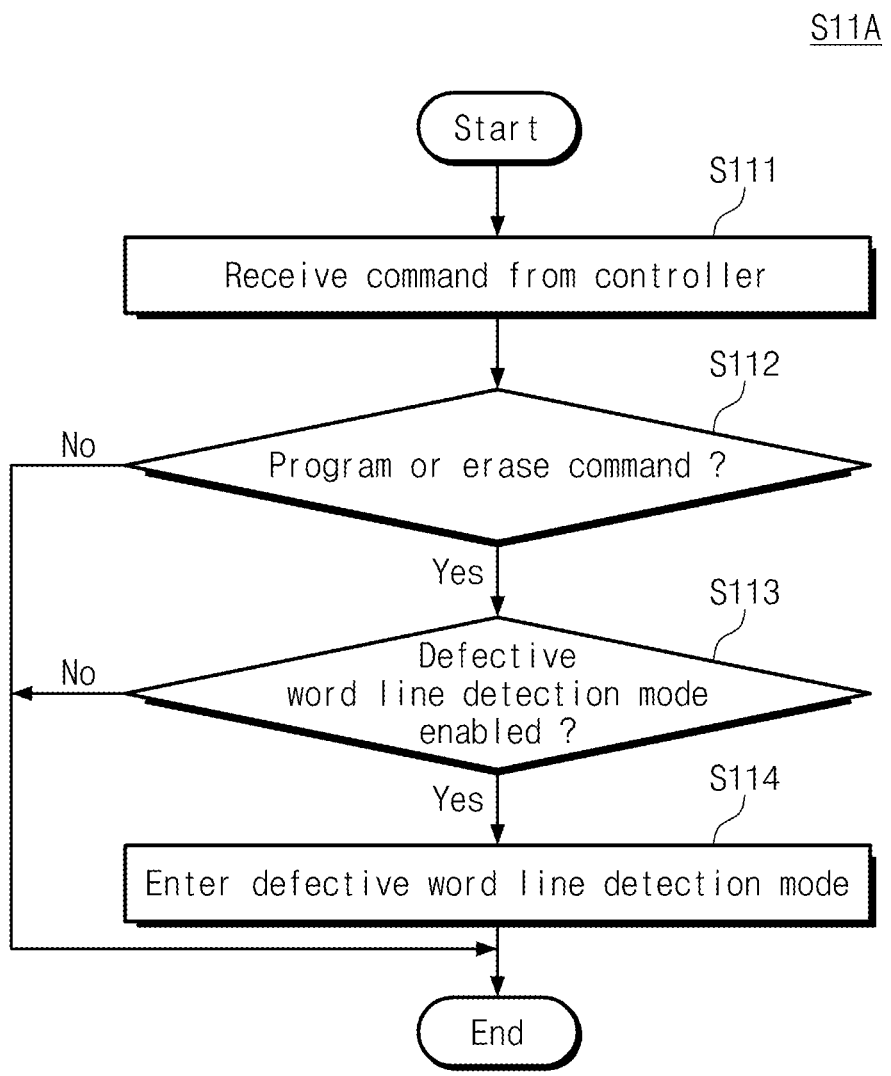
FIG. 14 is a flow chart summarizing an example of the step of entering a word line verification mode in the method of FIG. 13.

FIG. 14 is a flow chart summarizes in one example the step of entering the defective word line detection mode (S11) of FIG. 13. Here, it is assumed that the nonvolatile memory device 100 of FIG. 1 is configured to enter the defective word line detection mode in response to a corresponding, externally provided command.

Thus, the command is received (e.g.,) from a controller (S111).

Then, a determination is made as to whether or not the received command received indicates either a program operation or an erase operation (S112). If not (S112=No), the nonvolatile memory device 100 continues its operation without performing a defective word line detection operation.

However, if the received command indicates a program or erase operation (S112=Yes), a further determination is made as to whether the defective word line detection mode has been enabled (S113). If not (S113=No), the nonvolatile memory device 100 continues its operation without performing a defective word line detection operation. However, if the received command indicates a program or erase operation (S112=Yes) and the defective word line detection mode has been enabled (S113=Yes), then the nonvolatile memory device 100 executes the defective word line detection operation (S114). Thus, word line defectiveness may be ascertained in response to a received program command or a received erase command, where segment-by-segment word line responses may be respectively considered for a program voltage applied to the word line, or an erase voltage applied to the word line.

Figure 15:
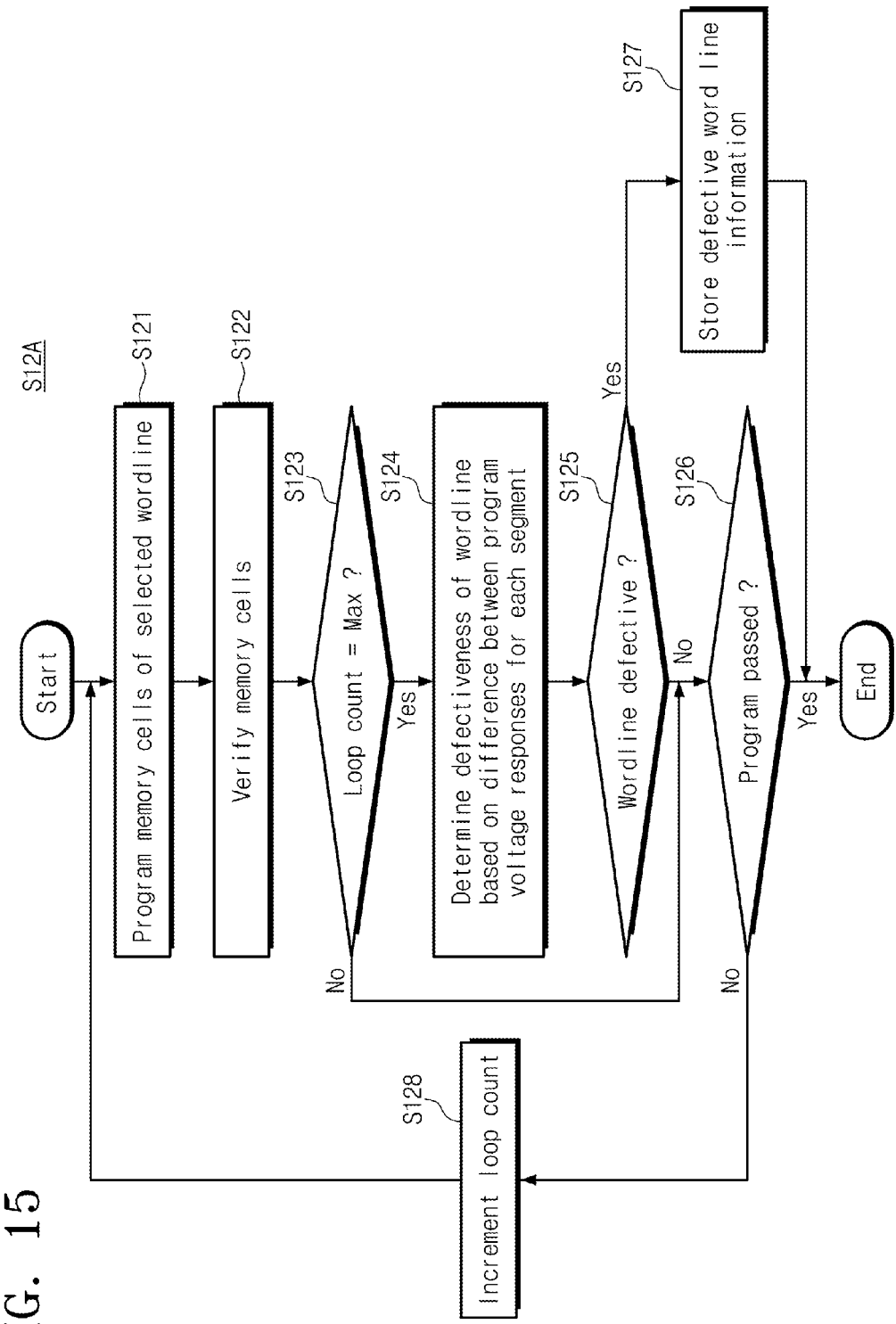
FIG. 15 is a flow chart summarizing an example of the step of determining word line defectiveness in the method of FIG. 13.

FIG. 15 is a flow chart summarizing in one example the step of executing a defective word line detection operation based on a program voltage (e.g., S12 of FIG. 13). Referring to FIGS. 1, 13 and 15, the nonvolatile memory device 100 is able to determine whether or not a word line is defective in relation to (e.g.,) the respective program speeds (program voltage responses) for each word line segment during a program operation indicated by a received command.

Thus, in response to a received program command (S111), a program operation is executed in relation to memory cells identified by the command and associated with a selected word line (S121). As is typical in flash memory devices, the program operation will be performed by applying a program voltage to the selected word line using the voltage generator 130 and address decoder 120. Here, the level (or amplitude) of the program voltage may be varied according to a number of constituent programming loops that form the program operation. The sequential execution of the programming loops is controlled by a loop count.

Thus, once the memory cells have been programmed during a particular loop, the threshold voltages for the memory cells are verified (S122) to determine whether or not all of the memory cells have been properly programmed by the executed loop. So long as the number of executed programming loops has not reached its maximum (S123=No), the programming operation continues with a determination based on the verification results (S122) as to whether or not the memory cells are all program passed (S126). If yes (S126=Yes), the program operation is ended, and if not, the programming loop is incremented (S128) and a next programming loop is executed (return to S121).

However, should the number of executed programming loops reach a defined maximum number (S123=Yes), the possible defectiveness of the selected word line will be determined (S124). That is, the respective program voltage responses for each segment of the selected word line will be considered by the control logic 150 and a determination based upon these program voltage responses may be made (S125).

Should the selected word line be deemed to be defective, corresponding defective word line information will be stored (S127) for subsequent reference by (e.g.,) the control logic 150 and/or the external controller.

Figure 16:
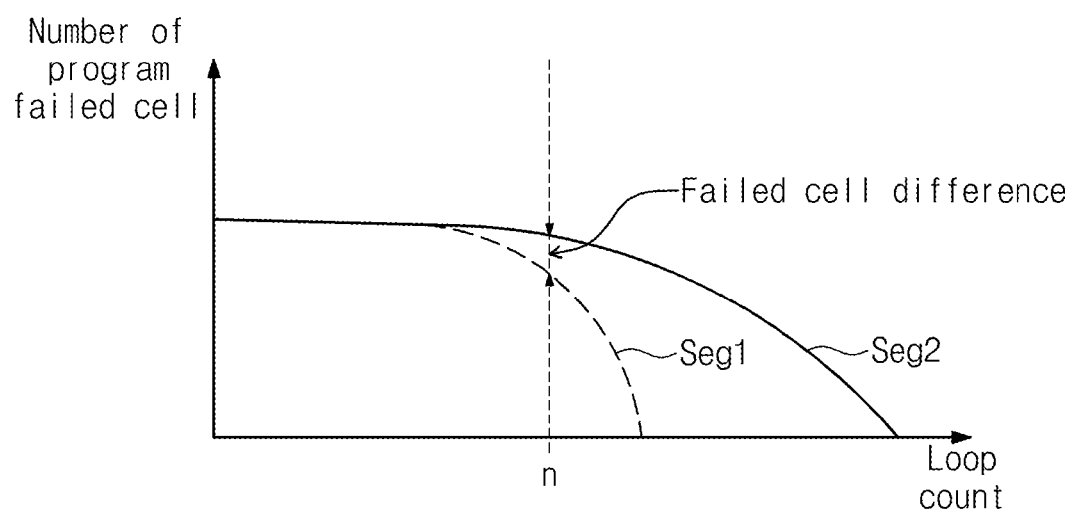
FIG. 16 is a graph further illustrating the determination of a defective word line according to a method consistent with certain embodiments of the inventive concept.

FIG. 16 is a graph showing an exemplary defective word line detection response as identified by the method of FIGS. 13, 14 and 15, for example.

Here, it is assumed that after maxing-out on a number of programming loops (S123=Yes), the control logic 150 causes execution of a defective word line detection operation in relation to the word line selected by the ongoing program operation. As with the example shown in FIG. 1, it is assumed that the selected word includes a first segment 111 (Seg1) and a second segment 112 (Seg2).

Now, the control logic considers respective program voltage responses for the first and second segments shown (e.g.,) in FIG. 12. Thus, in response to the applied program voltage, the second segment exhibits a slower response than the first segment, where the memory cells of the second segment having a slower voltage response are programmed at a slower speed than the memory cells of the first segment. In such a case, a resistive defect may be detected in the selected word line since a material programming speed difference for memory cells associated with respective word line segments is noted.

Thus, the control logic 150 may be used to determine the respective programming speeds for the first and second segments during one or more programming loops.

Program speed differences between the first and second segments can be determined using, for example, respective numbers of program failed cells for each segment as a function of programming loop(s). That is, the number of program failed cells for the first segment will more rapidly fall after an arbitrarily selected loop count ("n") than the number of program failed cells for the second segment. For example, the control logic 150 may detect the number of program failed cells for the first and second segments with reference to program failed cell information stored in page buffers of the I/O circuit 140 during a program verification operation (e.g., S122 in FIG. 5).

The control logic 150 may then calculate the number of program failed cells for the first and second segments, and calculate respective ratio(s) of program failed cells for the first and second segments for a particular programming loop over a range of programming loops. Then, the control logic 150 may compare the calculated difference or calculated ratio with a predetermined reference value. If the calculated difference or the calculated ratio is greater than the predetermined reference value, the control logic 150 will determine that the selected word line is defective, but if the calculated difference or the calculated ratio is smaller than the predetermined reference value, the control logic 150 will determine that the selected word line is not defective (i.e., is normal).

As described in the illustrated example of FIG. 16, the control logic 150 may be sued to determine a program speed difference for each word line segment in relation to a predetermined loop count using the number of program failed cells of each segment during the defective word line detection operation.

Figure 17:
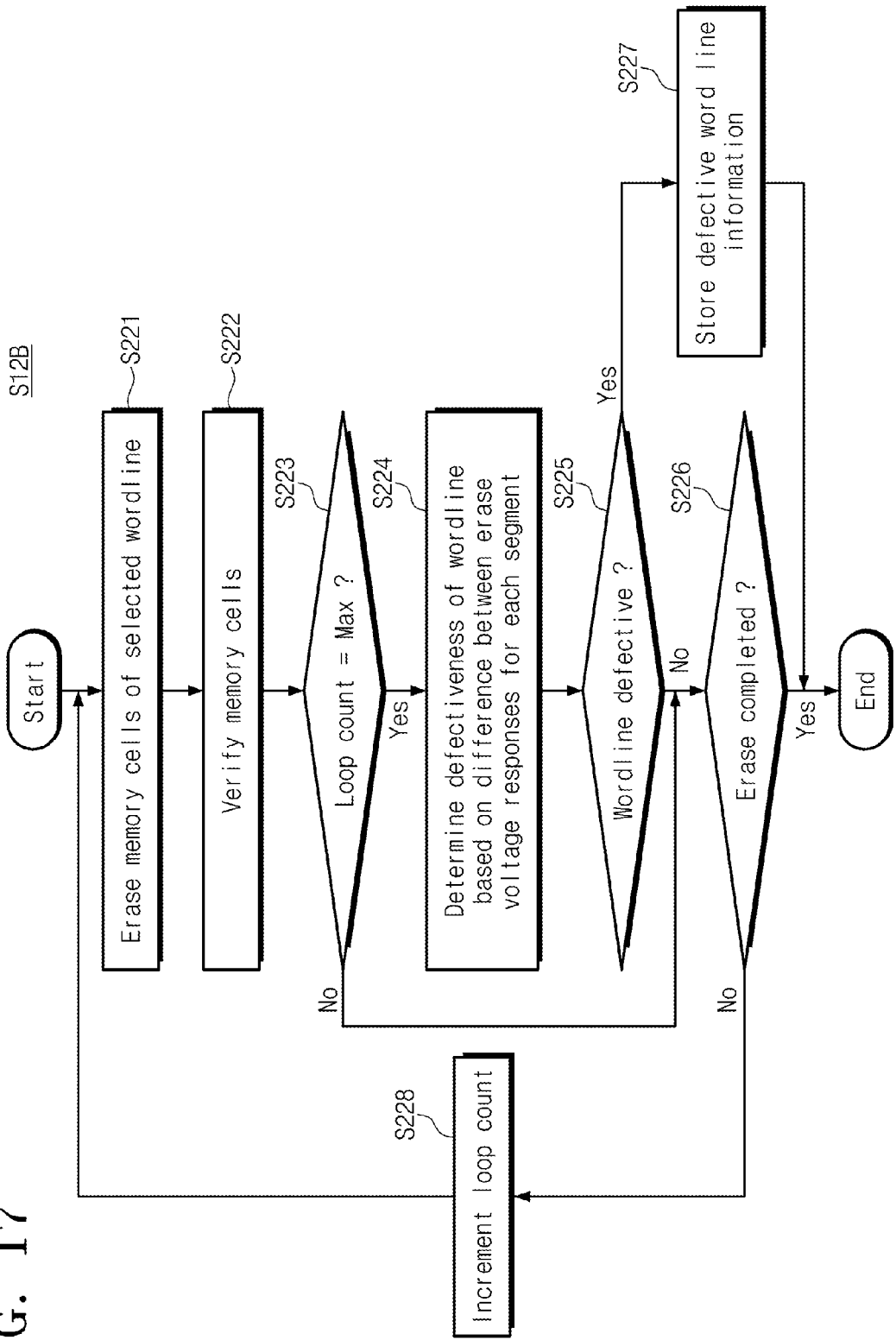
FIGS. 17 and 18 are respective flow charts summarizing additional examples of the step of determining word line defectiveness in the method of FIG. 13.

FIG. 17 is a flow chart summarizing in another example the step of executing a defective word line detection operation based on an erase voltage (e.g., S12 of FIG. 13). Referring to FIGS. 1, 13 and 17, the nonvolatile memory device 100 is able to determine whether or not a selected word line is defective in relation to respective erase voltage responses for difference word line segments during (or in conjunction with) an erase operation.

The method illustrated in FIG. 17 and its constituent steps are essentially the same as those previously described in relation to the method of FIG. 15, except that the command received (S221) indicates an erase operation should be performed for identified memory cells, and the defectiveness of the selected word line is determined in relation to the corresponding erase voltage applied to the selected word line (S224).

The erase operation may be performed using an incremental step pulse erase (ISPE) where the level of the applied erase voltage is varied with loop count during the erase operation.

So, after each erase loop execution (S221), the threshold voltage of the memory cells is verified (S222), and the loop count is monitored (S223).

As with a maximum programming loop count, the maximum erase loop count may be set in accordance with memory system specifications or user needs.

When the loop count reaches the maximum (S223=Yes), the control logic 150 will cause the nonvolatile memory device 100 to execute a defective word line detection operation (S224). The method then continues as before, except the determination of word line defectiveness (S224/S225) is made in relation to an erase voltage applied to the selected word line.

And again, defective word line information resulting from the determination may be stored (S227) for subsequent reference.

Figure 18:
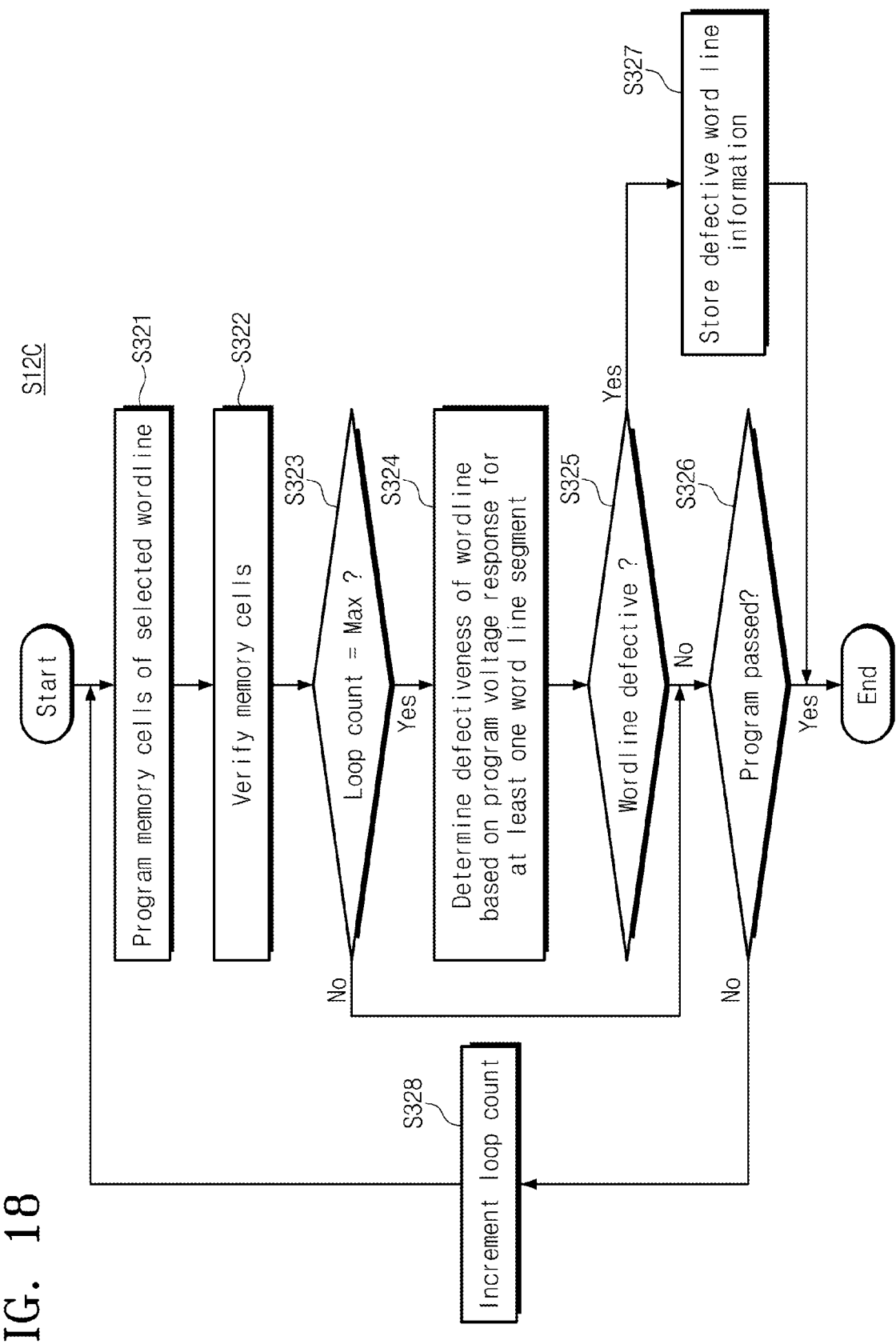

FIG. 18 is a flow chart summarizing in another example the step of executing a defective word line detection operation based on a program voltage (e.g., S12 of FIG. 13). Referring to FIGS. 1, 13 and 18, the nonvolatile memory device 100 is able to determine whether or not a selected word line is defective in relation to respective program voltage response for at least one word line segment during (or in conjunction with) a program operation.

The method illustrated in FIG. 18 and its constituent steps are essentially the same as those previously described in relation to the methods of FIGS. 15 and 17, except that the defectiveness of the selected word line is determined in relation to a program voltage response for at least one word line segment (S324).

That is, once the maximum number of programming loops has been reached (S323=Yes), a determination is made as to whether the selected word line is defective based on the program voltage response (or program speed) for at least one segment of the selected word line.

This determination may be made, for example, by comparing one or more segment specific program speed(s) with a reference speed value. The respective program speeds for each segment may be determined using a difference between the number of program failed cells in a predetermined loop count and the number of program failed cells in a current loop count. The program speed of each segment may be determined by a difference between the number of program failed cells in a current loop count (n) and the number of program failed cells in a previous loop count (n−1).

Figure 19:
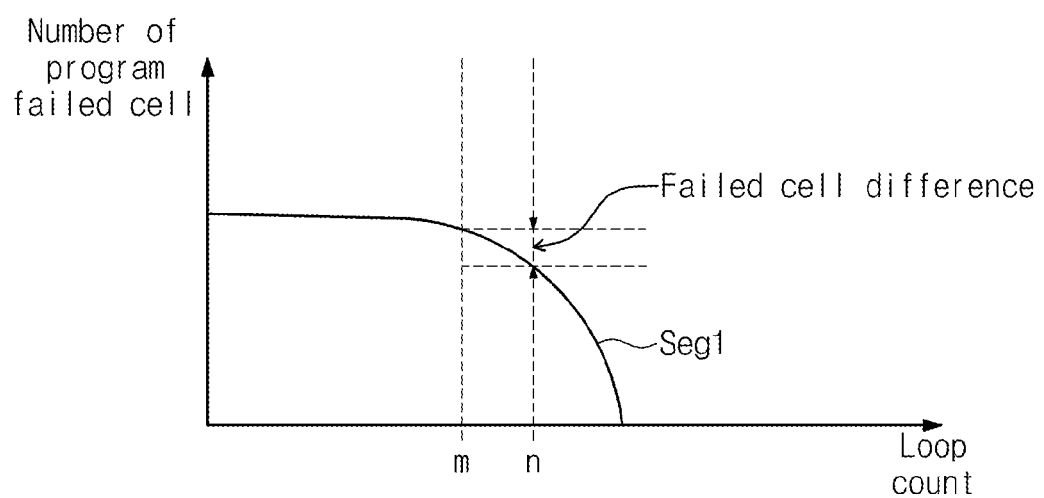
FIG. 19 is a graph further illustrating the determination of a defective word line according to a method consistent with certain embodiments of the inventive concept.

FIG. 19 is a graph further illustrating the step of determining the possible defectiveness of the selected word line (S324) in FIG. 18. Here again, the horizontal axis represents a loop count and the vertical axis represents a number of program failed cells. In FIG. 19, the number of program failed cells with respect to one segment (Seg1) is illustrated.

As a program operation proceeds through programming loops, the number of program failed cells is reduced. During the program operation, the program speed for a segment may be determined in relation to the speed with which the number of program failed cells is reduced in relation to one or more programming loops. For example, in a predetermined loop count (n), the program speed of each segment may be approximated to a difference between the number of program failed cells in a loop count (n) and the number of program failed cells in an antecedent loop count (m).

In a case where a resistive defect (e.g., a bridge) exists between the selected word line and adjacent word line, leakage current will flow from the selected word line to the adjacent word line, and the program speed of memory cells connected to the selected word line will be reduced due to the leakage current.

In the context of the illustrated embodiment of FIG. 1, the control logic 150 may be used to determine the program speed for at least one word line segment in relation to a predetermined loop count. The control logic 150 may respectively determine program speeds for one or more segments of the selected word line.

The control logic 150 may then compare the determined program speed with a predetermined reference value. If the determined program speed is smaller than the reference value, the control logic 150 will determine that the selected word line is defective, but if the determined program speed is greater than the reference value, the control logic 150 will determine that the selected word line is not defective (i.e., is normal).

Referring to FIGS. 1 and 19, the nonvolatile memory device 100 can perform a defective word line detection operation in relation to a predetermined loop count during a program operation. The nonvolatile memory device 100 can perform a defective word line detection operation by comparing a program speed of at least one segment measured during the predetermined loop count with the predetermined reference value.

Figure 20:
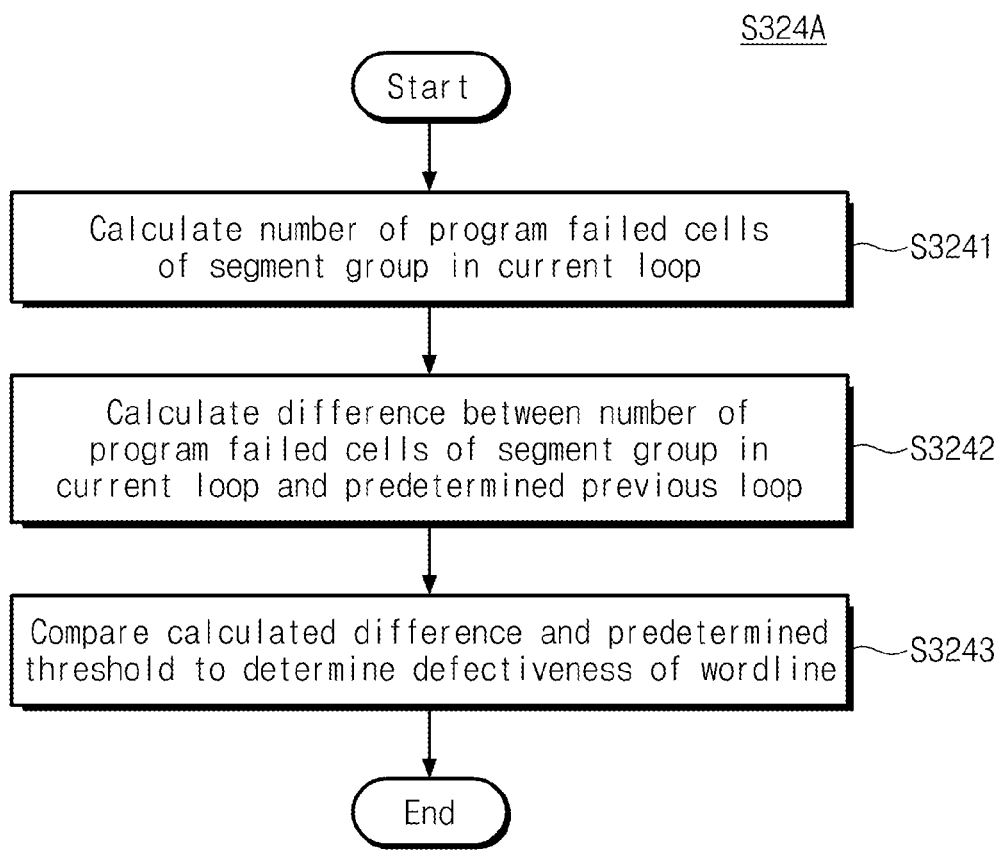
FIG. 20 is a flow chart summarizing a method of determining a defective word line in response to program speed for at least one segment of the word line using the approach illustrated in FIG. 18.

FIG. 20 is a flow chart further illustrating in one example the step (S324) of determining defectiveness of a word line in response to the program speed of at least one segment in accordance with the method of FIG. 18. Referring to FIGS. 1, 18, 19 and 20, as described with reference to FIG. 19, the nonvolatile memory device 100 is able to perform a defective word line detection operation by comparing a program speed for at least one segment in relation to a predetermined loop count and predetermined reference value.

First, the number of program failed cells of a segment group including at least one segment among segments connected to the selected word line is determined (S3241). Then, a difference between the number of program failed cells determined in the step S3241 and the number of program failed cells in a predetermined antecedent loop of the segment group (S3242). Here, the predetermined antecedent loop may be a loop immediately ahead of the current loop. However, the inventive concept is not limited to only this example of antecedent loop choice. Then, the difference of the number of program failed cells calculated in the step S3242 and a predetermined reference value are compared with each other (S3243).

If the difference in number of program failed cells is smaller than the reference value, the nonvolatile memory device 100 will determine that the selected word line is a defective word line, but if the difference in number of program failed cells is greater than the reference value, the nonvolatile memory device 100 will determine that the selected word is not defective (i.e., is normal).

The predetermined reference value may be differently designated depending on segment group. For example, since a segment group including segments located near the address decoder 120 in FIG. 1 has a relatively high program speed, this segment group may have a relatively higher reference value, and since a segment group including segments located farther away from the address decoder 120 has a low program speed, this segment group may have a relatively lower reference value.

The predetermined reference value may be differently designated depending on the nature of the program operation. For example, the reference value may be differently designated depending on whether the current program operation is directed to MLC or SLC.

The predetermined reference value may be stored in the memory cell array 110 of the nonvolatile memory device 100. The reference value stored in the memory cell array 110 may be loaded to the control logic 150 when the nonvolatile memory device 100 is started up. The reference value may be stored in a register included in the control logic 150.

The control logic 150 can perform a defective word line judgment operation using a selected reference value among a plurality of reference values stored. The control logic 150 can select a reference value in response to an external signal.

Figure 21:
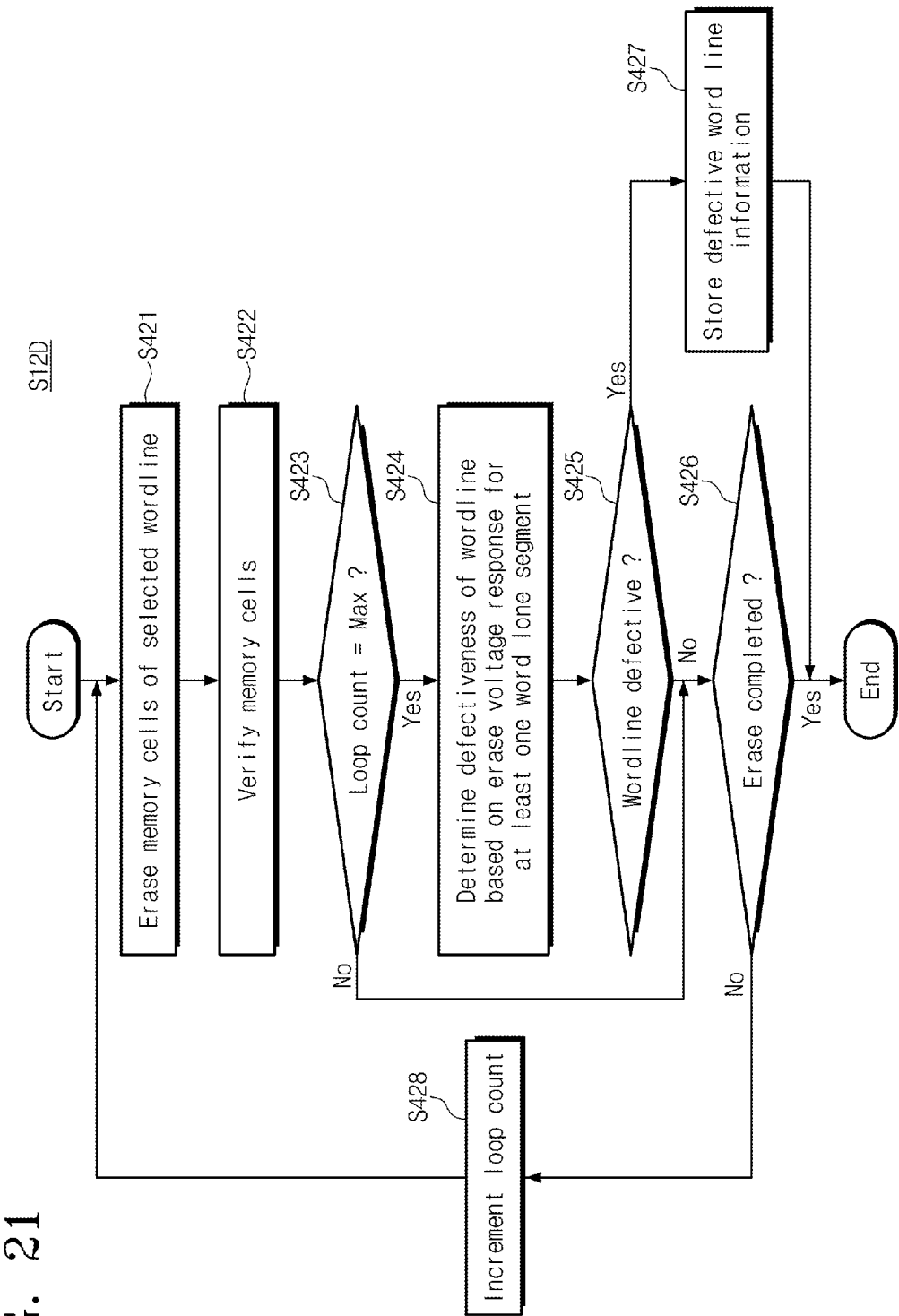
FIG. 21 is a flow chart summarizing an additional example of the step of determining word line defectiveness in the method of FIG. 13.

FIG. 21 is a flow chart summarizing in another example the step of executing a defective word line detection operation based on an erase voltage (e.g., S12 of FIG. 13). Referring to FIGS. 1, 13 and 21, the nonvolatile memory device 100 is able to determine whether or not a selected word line is defective in relation to respective erase voltage responses for at least one word line segment during (or in conjunction with) an erase operation.

FIG. 21 is a flow chart illustrating yet another embodiment of a defective word line judgment step S12 of FIG. 13. Referring to FIG. 21, the nonvolatile memory device 100 (refer to FIG. 1) can judge whether each word line is defective using an erase speed of at least one segment selected among segments constituting each word line during an erase operation.

In a step S421, an erase operation with reference to selection memory cells connected to a selected word line is performed. The erase operation can be performed using an erase voltage being applied to the selected word line. Amplitude of the erase voltage may vary in response to a loop count of a current program.

In a step S422, it is verified whether an erase of the memory cells erased in the step S421 is completed or not. Whether the erase is completed or not is determined by comparing a threshold voltage of the memory cells erased in the step S421 with a predetermined erase threshold voltage.

In a step S423, it is determined whether a current loop count belongs to a predetermined count set. The count set may be previously defined in control logic or may be set by a user.

In a step S424, in the case that a loop count belongs to the count set, whether or not the selected word line is defective is determined based on an erase speed of at least one segment selected among segments connected to the selected word line.

Whether or not the selected word line is defective can be determined by comparing the program speed of at least one segment with a predetermined reference value. The erase speed of at least one segment can be determined using a difference between the number of erase failed cells of the segment in a predetermined loop count and the number of erase failed cells in a current loop count. The erase speed of segments can be determined by a difference between the number of erase failed cells in a current loop count (n) and the number of erase failed cells in a previous loop count (n−1).

If it is determined that the word line is defective, in a step S427, information about the defective word line is stored.

If it is determined that the word line is not defective, in a step S426, it is determined whether an erase operation with respect to the selected word line is completed. If the erase operation is completed, it is determined that the word line is not defective and the erase operation is over.

If the operation with respect to the selected word line is not completed, in a step S428, a loop count increases. Erase and defective word line detection operations are repeated from the step S421 in response to the increased loop count.

According to the defective word line judgment step S12D, the defective word line detection operation can be performed in a predetermined loop count during the erase operation. The defective word line detection operation can be performed using an erase speed of at least one segment measured in a predetermined loop count and the predetermined reference value.

Figure 22:
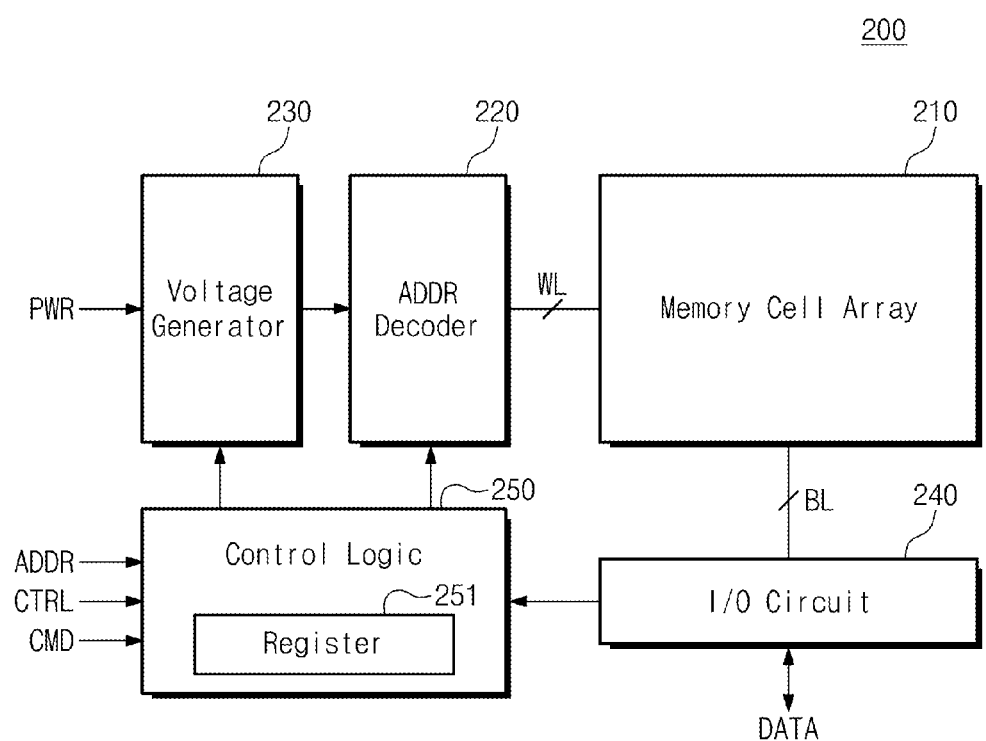
FIG. 22 is a block diagram illustrating a nonvolatile memory device in accordance with another embodiment of the inventive concept.

FIG. 22 is a block diagram illustrating a nonvolatile memory device 200 in accordance with another embodiment of the inventive concept. A memory cell array 210, an address decoder 220, a voltage generator 230, and an I/O circuit 240 of FIG. 22 have operations and constitutions similar to the memory cell array 110, the address decoder 120, the voltage generator 130, and the I/O circuit 140 of FIG. 1.

Control logic 250 includes a register 251. The register 251 can store information about whether each word line of the memory cell array 210 is defective. The control logic 250 can output information stored therein to the outside.

The control logic 250 can store predetermined reference values to be used in a defective word line detection operation in the register 251. The predetermined reference values can be selectively used depending on an external signal or an operation environment.

The nonvolatile memory device 200 is able to detect whether or not each word line is defective in relation to a program or erase response for respective segments of the selected word line. In addition, the control logic 250 of the nonvolatile memory device 200 includes a register that may be used to store a reference value being used in a defective word line detection operation and a detecting result. The nonvolatile memory device 200 may ensure reliability of data stored using the defective word line detection operation.

Figure 23:
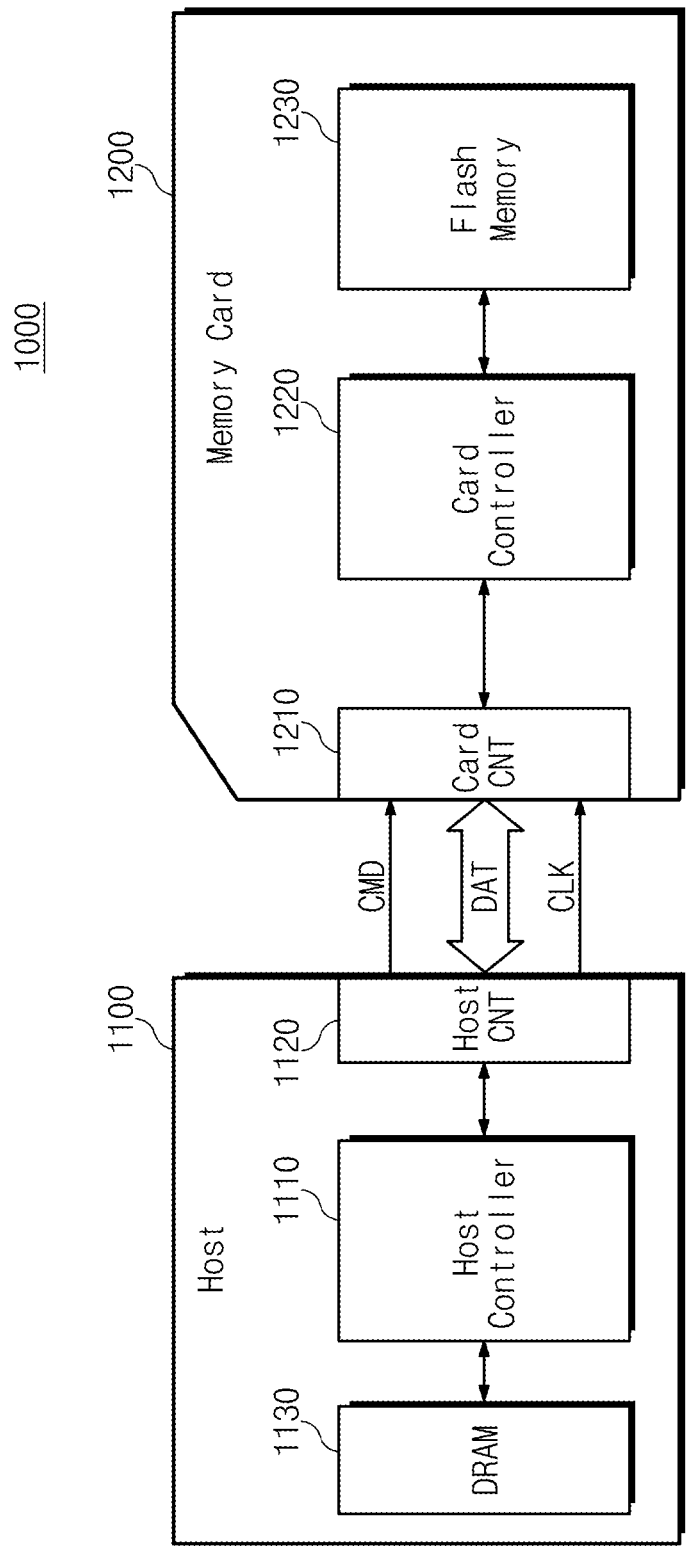
FIG. 23 is a block diagram illustrating a memory card system that may incorporate a nonvolatile memory device according to an embodiment of the inventive concept.

FIG. 23 is a block diagram illustrating a memory card system to which a nonvolatile memory device according to an embodiment of the inventive concept applies. A memory card system 1000 includes a host 1100 and a memory card 1200. The host 1100 includes a host controller 1110, a host connecting unit 1120 and a DRAM 1130.

The host 1100 writes data in the memory card 1200 or reads data stored in the memory card 1200. The host controller 1110 transmits a command (e.g., a write command), a clock signal CLK generated by a clock generator in the host 1100 and data DATA to the memory card 1200 through the host connecting unit 1120. The DRAM 1130 is a main memory of the host 1100.

The memory card 1200 includes a card connecting unit 1210, a card controller 1220 and a flash memory 1230. The card controller 1220 stores data in the flash memory 1230 in synchronization with a clock signal generated by a clock generator (not shown) in the card controller 1220 in response to a command received through the card connecting unit 1210. The flash memory 1230 stores data transmitted from the host 1100. For example, in the case that the host 1100 is a digital camera, the flash memory 1230 stores image data.

The memory card system 1000 can detect whether each word line is defective using a program or erase speed of segments connected to a word line of the flash memory 1230. The memory card system 1000 can guarantee reliability of data stored in the flash memory 1230 using a defective word line detection operation.

Figure 24:
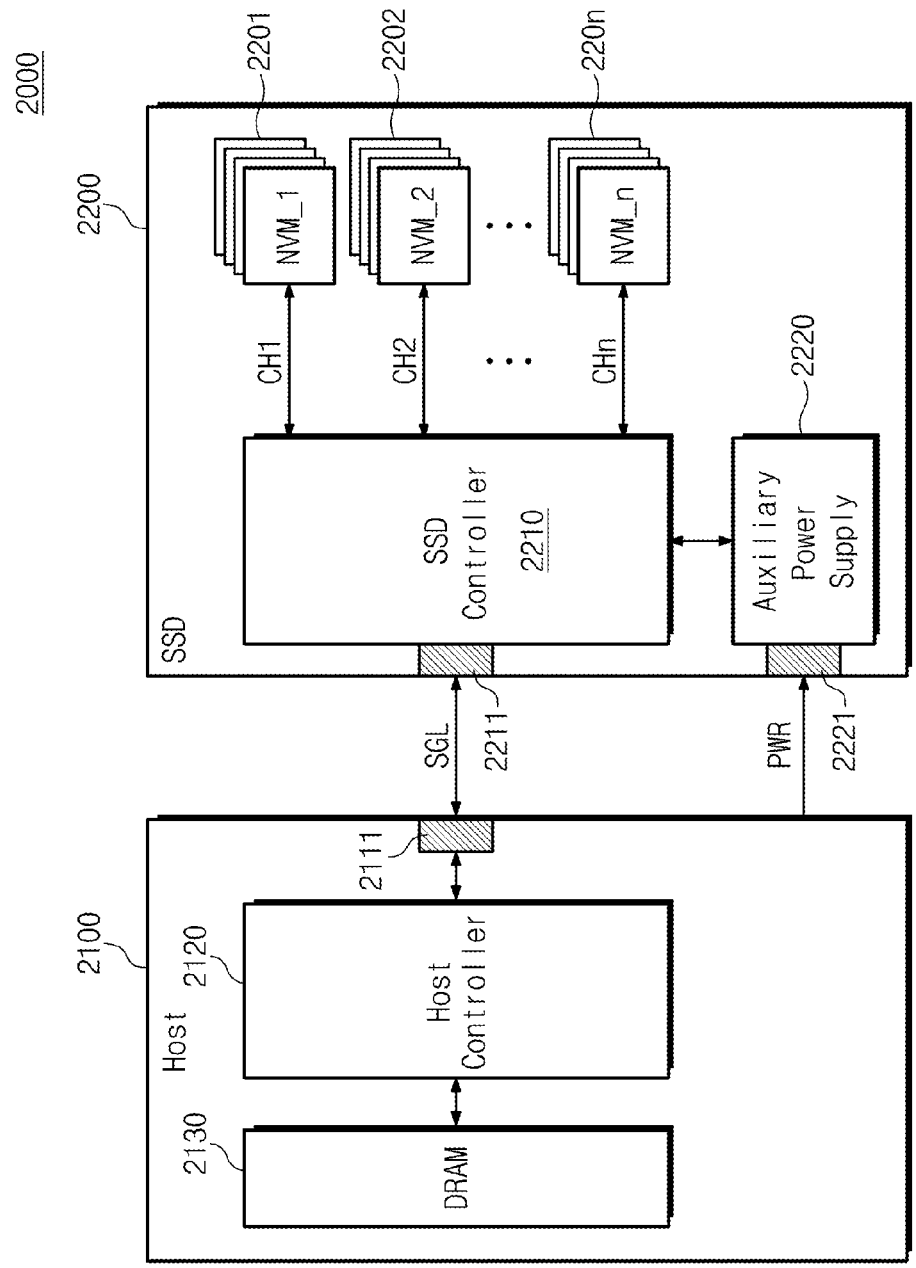
FIG. 24 is a block diagram illustrating a solid state drive (SSD) that may incorporate a nonvolatile memory device according to an embodiment of the inventive concept.

FIG. 24 is a block diagram illustrating a solid state drive (SSD) system to which a nonvolatile memory device according to an embodiment of the inventive concept applies. Referring to FIG. 24, a SSD system 2000 includes a host 2100 and a SSD 2200. The host 2100 includes a host interface 2111, a host controller 2120 and a DRAM 2130.

The host 2100 writes data in the SSD 2200 or reads data stored in the SSD 2200. The host controller 2120 transmits a signal SGL such as a command, an address, a control signal, etc. to the SSD 2200 through the host interface 2111. The DRAM 2130 is a main memory of the host 2100.

The SSD 2200 exchanges a signal SGL with the host 2100 through the host interface 2211 and is provided with power through a power connector 2221. The SSD 2200 may include a plurality of nonvolatile memories 2201~220n, a SSD controller 2210 and an auxiliary power supply 2220. The nonvolatile memories 2201~220n can be embodied by a PRAM, a MRAM, an ReRAM, a FRAM, etc. besides a NAND flash memory.

The nonvolatile memories 2201~220n are used as a storage medium of the SSD 2200. The nonvolatile memories 2201~220n can be connected to a SSD controller 2210 through a plurality of channels CH1~CHn. One or more nonvolatile memories can be connected to one channel. Nonvolatile memories connected to one channel can be connected to a same data bus.

The SSD controller 2210 exchanges a signal SGL with the host 2100 through the host interface 2211. The signal SGL may include a command, an address, data, etc. The SSD controller 2210 writes data in a corresponding nonvolatile memory device or reads data from a corresponding nonvolatile memory device according to a command of the host 2100.

The auxiliary power supply 2220 is connected to the host 2100 through the power connector 2221. The auxiliary power supply 2220 receives power from the host 2100 to be charged. The auxiliary power supply 2220 may be located inside the SSD 2200 or outside the SSD 2200. For example, the auxiliary power supply 2220 can be located on a main board to provide an auxiliary power to the SSD 2200.

Figure 25:
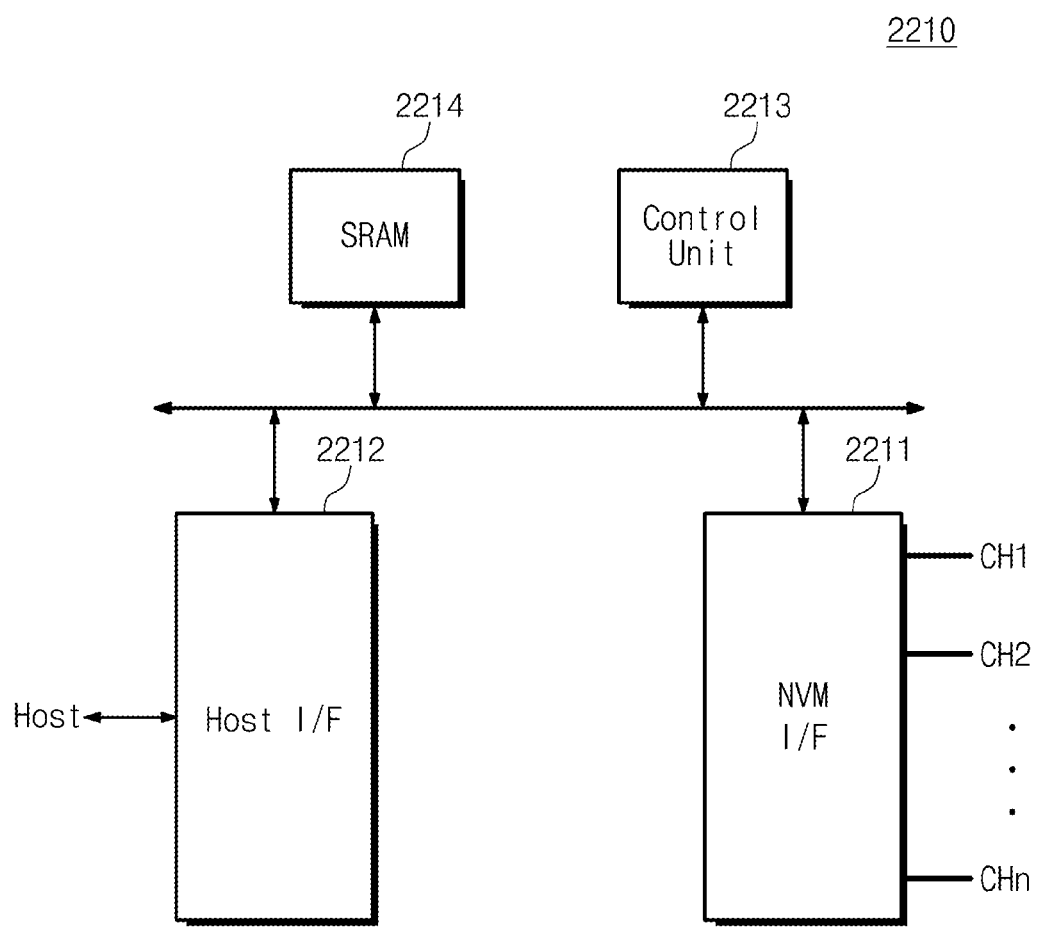
FIG. 25 is a block diagram illustrating one configuration example for the SSD controller 2210 of FIG. 24.

FIG. 25 is a block diagram illustrating a constitution of a SSD controller 2210 illustrated in FIG. 24. Referring to FIG. 25, the SSD controller 2210 includes an NVM interface 2211, a host interface 2212, a control unit 2213 and a SRAM 2214.

The NVM interface 2211 scatters data transmitted from a main memory of the host 2100 on respective channels CH1~CHn. The NVM interface 2211 transmits data read from the nonvolatile memories 2201~220n to the host 2100 through the host interface 2212.

The host interface 2212 corresponds to a protocol of the host 2100 to provide an interface with the SSD 2200. The host interface 2212 can communicate with the host 2100 using a universal serial bus (USB), a small computer system interface (SCSI), a PCI express, an ATA, a parallel ATA (PATA), a serial ATA (SATA), a serial attached SCSI (SAS), etc. The host interface 2212 can perform a disk emulation function of supporting so that the host 2100 recognizes the SSD 2200 as a hard disk drive (HDD).

The control unit 2213 analyzes a signal SGL received from the host 2100 to process it. The control unit 2213 controls the host 2100 or the nonvolatile memories 2201~220n through the host interface 2212 or the NVM interface 2211. The control unit 2213 controls an operation of the nonvolatile memories 2201~220n according to a firmware for driving the SSD 2200.

The SRAM 2214 can be used to drive software (S/W) being used for an efficient management of the nonvolatile memories 2201~220n. The SRAM 2214 can store meta data received from a main memory of the host 2100 or stores cache data. In a sudden power off operation, meta data or cache data stored in the SRAM 2214 can be stored in the nonvolatile memories 2201~220n using the auxiliary power supply 2220.

Further referring to FIG. 24, the SSD system 2000 can detect whether each word line is defective using a program or erase speed of segments connected to a word line of the nonvolatile memories 2201~220n. The SSD system 2000 can guarantee reliability of data stored in the nonvolatile memories 2201~220n using a defective word line detection operation.

In FIGS. 24 and 25, the SRAM 2214 can be replaced with a nonvolatile memory. The SSD system in accordance with another embodiment of the inventive concept can be embodied so that a nonvolatile memory device such as a flash memory, a PRAM, an RRAM, a MRAM, etc. performs a function of the SRAM 2214.

Figure 26:
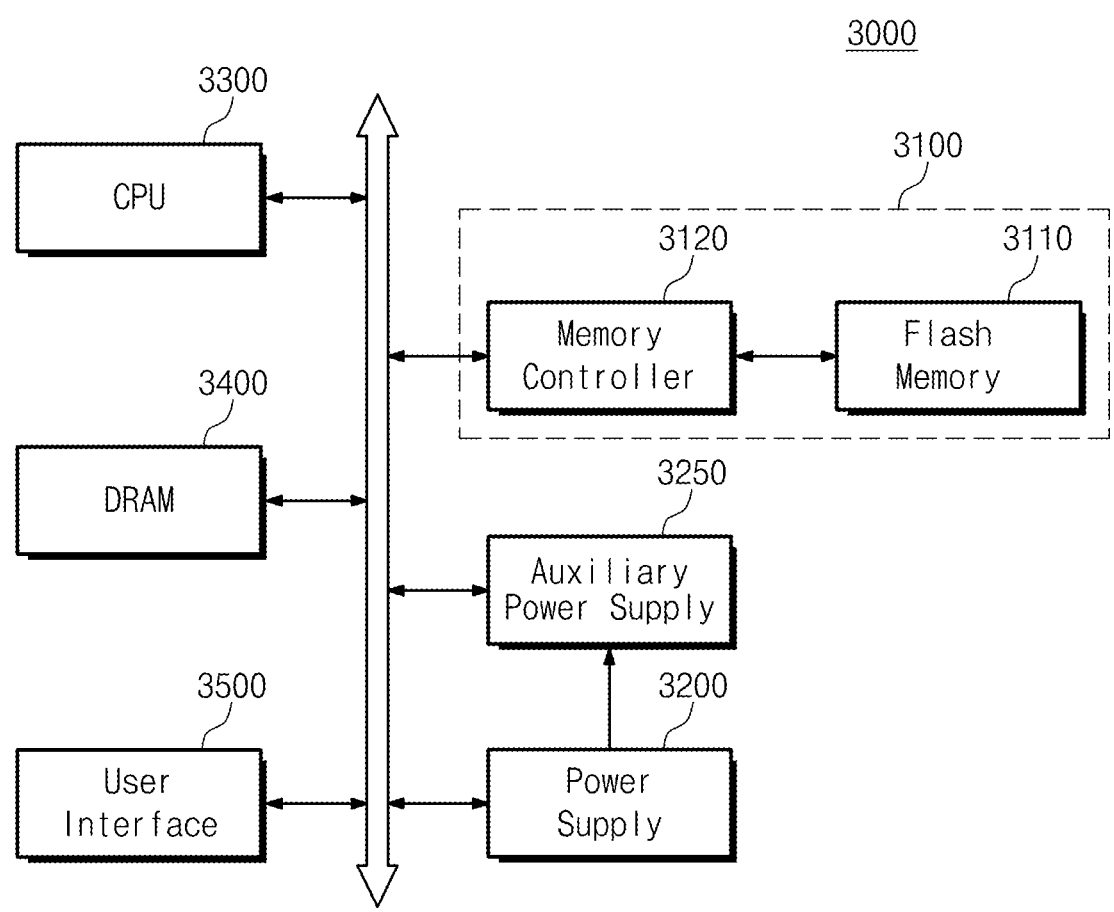
FIG. 26 is a block diagram illustrating an electronic device that may incorporate a nonvolatile memory device according to an embodiment of the inventive concept.

FIG. 26 is a block diagram illustrating an example that a nonvolatile memory device according to an embodiment of the inventive concept is embodied by an electronic device. An electronic device 3000 may be embodied by a personal computer PC or a portable electronic device such as a notebook computer, a cell phone, a personal digital assistant (PDA), and a camera.

Referring to FIG. 26, the electronic device 3000 includes a memory device 3100, a power supply 3200, an auxiliary power supply 3250, a central processing unit 3300, a DRAM 3400, and a user interface 3500. The memory device 3100 includes a flash memory 3110 and a memory controller 3120. The memory device 3100 can be built in the electronic device 3000.

As described above, the electronic device 3000 can detect whether each word line is defective using a program or erase speed of segments connected to a word line of the flash memory 3110. The electronic device 3000 can guarantee reliability of data stored in the flash memory 3110 using a defective word line detection operation.

The foregoing embodiments are illustrative of the inventive concept and should not be construed as limiting thereof. Although a few embodiments of the inventive concept have been described, those skilled in the art will readily appreciate that many modifications are possible in the embodiments without materially departing from the novel teachings and advantages of the present inventive concept. Accordingly, all such modifications are intended to be included within the scope of the present invention as defined by the following claims.

What is claimed is:

1. A nonvolatile memory device comprising:
 a voltage generator;
 a memory cell array comprising a word line directly connected to first and second segments, wherein the first segment includes first memory cells being less than a prescribed distance from the voltage generator and the second segment includes second memory cells being more than the prescribed distance from the voltage generator; and
 a control logic configured to determine whether or not the word line is defective in relation to respective word line voltage responses for the first and second segments during one of a program operation and an erase operation directed to a page of data stored by the first and second memory cells, wherein:
 the control logic determines, from the word line voltage responses for the first and second segments, whether the word line is defective based on:
  a difference between a number of program fail cells among the first memory cells and a number of program fail cells among the second memory cells,
  a ratio of the number of program fail cells to all programmed cells for one of the first and second memory cells, or
  a difference between the number of program fail cells among one of the first memory cells and the second memory cells in sequential program or erase operation loops.

2. The nonvolatile memory of claim 1, wherein the respective word line voltage responses for the first and second segments occur in relation to a program voltage applied to the word line during the program operation.

3. The nonvolatile memory of claim 1, wherein the respective word line voltage responses for the first and second segments occur in relation to an erase voltage applied to the word line during the erase operation.

4. The nonvolatile memory device of claim 2, wherein the control logic determines the respective word line voltage responses according to the number of program fail cells among the first and second memory cells for a programming loop count during the program operation.

5. The nonvolatile memory device of claim 3, wherein the control logic determines the respective word line voltage responses according to the number of program fail cells among the first and second memory cells for an erase loop count during the erase operation.

6. A method of detecting a defective word line in a nonvolatile memory device including a plurality of word lines directly connected to first and second segments, the first segment including first memory cells being less than a prescribed distance from a voltage generator and the second segment including second memory cells being more than the prescribed distance from the voltage generator, the method comprising:
 entering a defective word line detection mode; and
 in response to a received program command indicating a program operation directed to the first and second memory cells, executing a defective word line detection operation using a program voltage applied to a selected word line, wherein the defective word line detection operation determines whether or not the selected word line is defective in relation to respective word line voltage responses for the first and second segments during execution of the program operation, wherein:
 the defective word line detection operation determines, from the word line voltage responses for the first and second segments, whether the selected word line is defective based on:
  a difference between a number of program fail cells among the first memory cells and a number of program fail cells among the second memory cells,
  a ratio of the number of program fail cells to all programmed cells for one of the first and second memory cells, or a difference between the number of program fail cells among one of the first memory cells and the second memory cells in sequential program or erase operation loops.

7. The method of claim 6, further comprising:
programming the first and second memory cells in response to the program command:
verifying threshold voltages of the first and second memory cells after the programming of the first and second memory cells and generating a corresponding verification result;
determining whether or not a loop count for programming loops of the program operation has reached a maximum; and
upon determining that the loop count has reached the maximum, executing the defective word line detection operation.

8. The method of claim 7, wherein the respective word line voltage responses for the first and second segments are determined for a predetermined programming loop of the program operation.

9. The method of claim 6, wherein the execution of the defective word line detection operation generates defective word line information, and the method further comprises storing the defective word line information.

10. The method of claim 7, further comprising:
upon determining that the loop count has not reached the maximum, determining in relation to the verification result whether all of the first and second memory cells are program passed; and
if all of the first and second memory cells are program passed, ending the program operation, else incrementing the loop count and executing a next programming loop.

11. The method of claim 6, wherein the executing of the defective word line detection operation comprises:
for a predetermined programming loop of the program operation, determining respective numbers of program fail memory cells among the first and second memory cells, and comparing the respective numbers of fail memory cells among the first and second memory cells to a reference value in order to determine whether the word line is defective.

12. The method of claim 11, wherein the reference value is stored in the nonvolatile memory in response to an externally provided signal.

13. The method of claim 12, wherein the determining of whether the word line is defective is made according to the difference between the number of program failed cells among the first memory cells and the number of program fail cells among the second memory cells.

14. A method of detecting a defective word line in a nonvolatile memory device including a plurality of word lines directly connected to first and second segments, the first segment including first memory cells being less than a prescribed distance from a voltage generator and the second segment including second memory cells being more than the prescribed distance from the voltage generator, the method comprising:
entering a defective word line detection mode; and
in response to a received erase command indicating an erase operation directed to the first and second memory cells, executing a defective word line detection operation using an erase voltage applied to a selected word line, wherein the defective word line detection operation determines whether or not the selected word line is defective in relation to respective word line voltage responses for the first and second segments during execution of the erase operation, wherein:
the defective word line detection operation determines, from the word line voltage responses for the first and second segments, whether the selected word line is defective based on:
a difference between a number of program fail cells among the first memory cells and a number of program fail cells among the second memory cells,
a ratio of the number of program fail cells to all programmed cells for one of the first and second memory cells, or
a difference between the number of program fail cells among one of the first memory cells and the second memory cells in sequential program or erase operation loops.

15. The method of claim 14, further comprising:
erasing the first and second memory cells in response to the erase command:
verifying threshold voltages of the first and second memory cells after the erasing of the first and second memory cells and generating a corresponding verification result;
determining whether or not a loop count for programming loops of the program operation has reached a maximum; and
upon determining that the loop count has reached the maximum, executing the defective word line detection operation.

16. The method of claim 15, wherein the respective word line voltage responses for the first and second segments are determined for a predetermined programming loop of the erase operation.

17. The method of claim 14, wherein the execution of the defective word line detection operation generates defective word line information, and the method further comprises storing the defective word line information.

18. The method of claim 15, further comprising:
upon determining that the loop count has not reached the maximum, determining in relation to the verification result whether all of the first and second memory cells are program passed; and
if all of the first and second memory cells are program passed, ending the program operation, else incrementing the loop count and executing a next erasing loop.

19. The method of claim 14, wherein the executing of the defective word line detection operation comprises:
for a predetermined programming loop of the erase operation, determining respective numbers of erase failed memory cells among the first and second memory cells, and comparing the respective numbers of failed memory cells among the first and second memory cells to a reference value in order to determine whether the word line is defective.

20. The method of claim 19, wherein the reference value is stored in the nonvolatile memory in response to an externally provided signal.

* * * * *